United States Patent
Sorgeloos et al.

(10) Patent No.: US 9,881,914 B2
(45) Date of Patent: Jan. 30, 2018

(54) ELECTROSTATIC DISCHARGE PROTECTION DEVICE

(71) Applicant: Sofics BVBA, Gistel (BE)

(72) Inventors: Bart Sorgeloos, Gistel (BE); Benjamin Van Camp, Gistel (BE); Sven Van Wijmeersch, Gistel (BE); Wim Vanhouteghem, Gistel (BE)

(73) Assignee: SOFICS BVBA, Gistel (BE)

( * ) Notice: Subject to any disclaimer, the term of this patent is extended or adjusted under 35 U.S.C. 154(b) by 0 days.

(21) Appl. No.: 15/587,780

(22) Filed: May 5, 2017

(65) Prior Publication Data

US 2017/0243864 A1   Aug. 24, 2017

Related U.S. Application Data

(63) Continuation of application No. 15/161,627, filed on May 23, 2016, now Pat. No. 9,653,453, which is a continuation of application No. 13/760,367, filed on Feb. 6, 2013, now Pat. No. 9,349,716.

(60) Provisional application No. 61/595,893, filed on Feb. 7, 2012.

(51) Int. Cl.
| | |
|---|---|
| *H01L 27/02* | (2006.01) |
| *H01L 29/08* | (2006.01) |
| *H01L 29/10* | (2006.01) |
| *H01L 29/06* | (2006.01) |
| *H01L 27/06* | (2006.01) |
| *H02H 9/04* | (2006.01) |

(52) U.S. Cl.
CPC ...... *H01L 27/0262* (2013.01); *H01L 27/0647* (2013.01); *H01L 29/0688* (2013.01); *H01L 29/0804* (2013.01); *H01L 29/0821* (2013.01); *H01L 29/1004* (2013.01); *H02H 9/046* (2013.01)

(58) Field of Classification Search
CPC .............. H01L 27/0262; H01L 29/87
See application file for complete search history.

(56) References Cited

U.S. PATENT DOCUMENTS

| | | | |
|---|---|---|---|
| 5,648,676 A | 7/1997 | Iwai et al. | |
| 5,747,837 A | 5/1998 | Iwase et al. | |
| 6,078,083 A | 6/2000 | Amerasekera et al. | |
| 6,236,087 B1 | 5/2001 | Daly et al. | |
| 7,456,441 B2 * | 11/2008 | Tyler | H01L 27/0262 257/173 |
| 8,395,231 B2 | 3/2013 | Terashima | |

(Continued)

FOREIGN PATENT DOCUMENTS

| | | |
|---|---|---|
| EP | 2 482 314 | 8/2012 |
| JP | 2007-189048 | 7/2007 |

*Primary Examiner* — Mohsen Ahmadi
*Assistant Examiner* — Fang-Xing Jiang
(74) *Attorney, Agent, or Firm* — Volpe and Koenig, P.C.

(57) ABSTRACT

An electrostatic discharge (ESD) protection device is disclosed including at least an NPN transistor and a PNP transistor coupled between a first node and a second node, wherein the ESD protection device may be configured to sink current from the first node to the second node in response to an ESD event. The transistors may be coupled such that a collector of the NPN may be coupled to the first node. A collector of the PNP may be coupled to the second node. A base of the NPN may be coupled to the emitter of the PNP. An emitter of the NPN may be coupled to a base of the PNP.

22 Claims, 20 Drawing Sheets

(56) References Cited

U.S. PATENT DOCUMENTS

| | | |
|---|---|---|
| 9,685,431 B2* | 6/2017 | Sorgeloos ........... H01L 27/0262 |
| 2002/0027755 A1 | 3/2002 | Andresen et al. |
| 2008/0067602 A1 | 3/2008 | Tyler et al. |
| 2011/0068366 A1* | 3/2011 | Huang ................ H01L 27/0262 |
| | | 257/173 |
| 2011/0204415 A1* | 8/2011 | Van Wijmeersch .... H01L 29/87 |
| | | 257/154 |

* cited by examiner

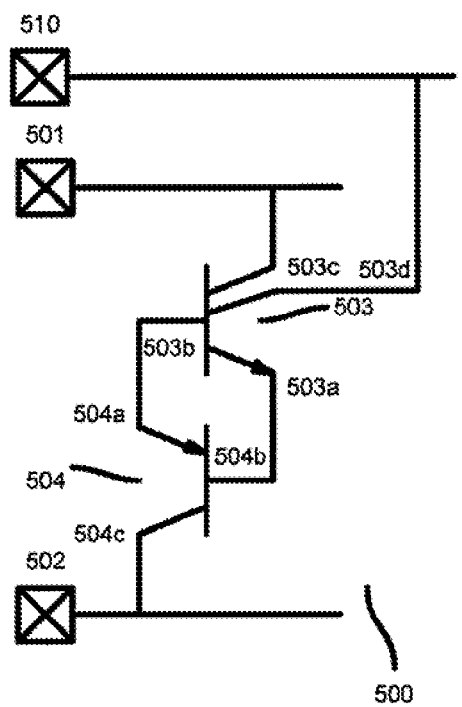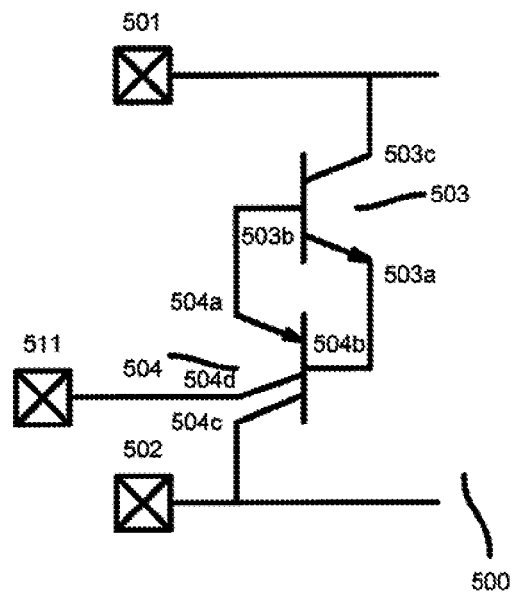
FIG. 5A
FIG. 5B

ELECTROSTATIC DISCHARGE PROTECTION DEVICE

CROSS REFERENCE TO RELATED APPLICATIONS

This application is a continuation of U.S. patent application Ser. No. 15/161,627, filed May 23, 2016, which is a continuation of U.S. patent application Ser. No. 13/760,367, filed Feb. 6, 2013, which issued on May 24, 2016 as U.S. Pat. No. 9,349,716, which claims the benefit of U.S. Provisional Application 61/595,893 filed Feb. 7, 2012, the contents of which are hereby incorporated by reference herein.

FIELD OF THE DISCLOSURE

The disclosure generally relates to Electrostatic Discharge (ESD) protection, Latch-up (LU) prevention, and prevention of damage during Electrical Overstress (EOS) conditions. More specifically, the disclosure relates to a method of protecting an Integrated Circuit (IC) against ESD damages, while maintaining high levels of robustness against LU and EOS protection.

BACKGROUND

During ESD, large currents can flow through an IC and can potentially cause damage. Damage can occur within the device that conducts the current, as well as in devices that see a significant voltage drop due to the large current flow. To avoid damage due to an ESD event, clamps may be added to the IC. These clamps shunt the large ESD current without causing high voltage over sensitive nodes of the IC.

One ESD clamp design consideration may be to prevent the clamp from accidentally shunting current during normal operating conditions. Accidentally shunting current during normal operating conditions may result in a temporary loss of function and may require human or other IC interaction to restore the normal operation. Furthermore, a clamp triggering during normal operation may cause permanent damage to the IC due to excess current draw. If the clamp triggers in low conductive (shunt) mode during normal operation, the energy of the current through the clamp may be too high such that temporary or permanent damage can occur. An increased (supply) current during normal operation caused by faulty triggering of the ESD device may be called a latch-up event, and might result in temporary loss of function, temporary damage, or permanent damage to the IC. EOS may be caused by unwanted high voltages at IC pins.

A known way to overcome these issues may include creating ESD clamps with a high clamping voltage. The clamping voltage of the clamp may be the lowest voltage at which the device can sustain its high conductive state. By increasing the clamping voltage above the supply level, the ESD clamp may be designed to release from the latched state even if triggered during normal operation, such that the loss of function may be temporary.

For some applications, such as automotive, it may be preferable to have a clamping voltage much higher than the supply level to avoid temporary loss of function due to noise spikes, or to allow off-chip ESD protection to shunt system-level ESD currents without triggering the on-chip ESD protection.

A further design constraint for the ESD protection clamp may include low standby or leakage current. For some applications, the amount of capacitance added to the pad may be minimized as well.

One way to provide ESD protection may be to use Zener diodes or reverse diodes as ESD clamps. But the performance of these clamps may be very low and a large area may be needed. Very often additional layers may be needed to tune the clamping voltage.

The performance per area could be improved by using a gate-grounded n-type metal oxide semiconductor (GGNMOS), but oxide reliability issues may occur and in high voltage applications the NMOS may not survive snapback.

There is a need for improved ESD protection with a high clamping voltage and efficient area usage without oxide reliability issues.

SUMMARY

An electrostatic discharge (ESD) protection device is disclosed. The ESD protection device may be coupled between a first node and a second node. The ESD protection device may include a first lowly doped region of a second dopant type and a second lowly doped region of a first dopant type formed within the first lowly doped region. The ESD protection device may further include a first highly doped region of the first dopant type formed within the first lowly doped region and coupled to the first node, and a second highly doped region of the second dopant type formed within the second lowly doped region and coupled to the second node. The ESD protection device may be configured to trigger to suppress an ESD event between the first node and the second node.

In one embodiment, the ESD protection device may include a third lowly doped region of a first dopant type formed within the first lowly doped region, wherein the first highly doped region may be formed within the third lowly doped region.

In another embodiment, the ESD protection device may include a third lowly doped region of a second dopant type formed within the first lowly doped region, wherein the first highly doped region may be formed within the third lowly doped region.

In another embodiment, the ESD protection device may include a biasing element coupled between the first highly doped region and the first lowly doped region, wherein the biasing element may be configured to control a voltage across a reverse-biased junction formed by the first highly doped region and the first lowly doped region, and further wherein the junction voltage may determine a triggering current of the ESD protection device.

In another embodiment, the ESD protection device may include a biasing element coupled between the second highly doped region and the second lowly doped region, wherein the biasing element may be configured to control a voltage across a reverse biased junction formed by the second highly doped region and the second lowly doped region, and further wherein the junction voltage may determine a triggering current of the ESD protection device.

In another embodiment, the biasing element may include at least one of: a resistor, a resistive connection, an inductor, a capacitor, a reverse junction, a forward junction, an NMOS, a PMOS, and a bipolar transistor.

In another embodiment, the ESD protection device may include a third lowly doped region of the P dopant type and a fourth lowly doped region of the N dopant type formed within the third lowly doped region. The first lowly doped region may be formed within the fourth lowly doped region.

In another embodiment, the ESD protection device may be coupled between a first node and a second node. The ESD protection device may include a first lowly doped region of a first dopant type and a second lowly doped region of a second dopant type formed within the first lowly doped region. The ESD protection device may further include a first highly doped region of the first dopant type formed within the second lowly doped region and coupled to the first node, and a second highly doped region of the second dopant type formed within the first lowly doped region and coupled to the second node. The ESD protection device may be configured to trigger to suppress an ESD event between the first node and the second node.

In another embodiment, the ESD protection device may include a third lowly doped region of a first dopant type formed within the first lowly doped region, wherein the second highly doped region may be formed within the third lowly doped region.

In another embodiment, the ESD protection device may include a third lowly doped region of a second dopant type formed within the first lowly doped region, wherein the second highly doped region may be formed within the third lowly doped region.

In another embodiment, the ESD protection device may include a biasing element coupled between the first highly doped region and the second lowly doped region, wherein the biasing element may be configured to control a voltage across reverse biased a junction formed by the first highly doped region and the second lowly doped region, and further wherein the junction voltage may determine a triggering current of the ESD protection device.

In another embodiment, the ESD protection device may include a biasing element coupled between the second highly doped region and the first lowly doped region, wherein the biasing element may be configured to control a voltage across a reverse biased junction formed by the second highly doped region and the first lowly doped region, and further wherein the junction voltage may determine a triggering current of the ESD protection device.

In another embodiment, the first dopant type may be an N type and the second dopant type may be a P type.

In another embodiment, an ESD protection device may be coupled between a first node and a second node. The ESD protection device may comprise an NPN transistor including a first collector functioning as an anode, a first emitter, and a first base. The ESD protection device may further comprise a PNP transistor including a second collector functioning as a cathode, a second emitter, and a second base. The first collector may be coupled to the first node, the second collector may be coupled to the second node, the first base may be coupled to the second emitter, and the first emitter may be coupled to the second base. The ESD protection device may be further configured to sink current from the first node to the second node in response to an ESD event.

In another embodiment, the ESD protection device may further include a biasing element coupled between the first collector and the first base, wherein the biasing element may be configured to control a voltage across a reverse biased junction formed by the first collector and the first base, and further wherein the junction voltage may determine a triggering current of the ESD protection device.

In another embodiment, the ESD protection device may further include a biasing element coupled between the second base and the second collector, wherein the biasing element may be configured to control a reverse-junction voltage across a junction formed by the second base and the second collector, and further wherein the reverse junction voltage may determine a triggering current of the ESD protection device.

In another embodiment, the ESD protection device may further include a first lowly doped region functioning as the first base of the NPN transistor and the second emitter of the PNP transistor, wherein the first lowly doped region may be doped with a dopant of a P-type. The ESD protection device may further include a second lowly doped region functioning as the first emitter of the NPN transistor and the second base of the PNP transistor, wherein the second lowly doped region may be doped with a dopant of an N-type, and the second lowly doped region may be formed in the first lowly doped region. The ESD protection device may further include a first highly doped region functioning as the first collector of the NPN transistor, wherein the first highly doped region may be doped with a dopant of the N-type, the first highly doped region may be formed in the first lowly doped region, and the first highly doped region may be coupled to the first node. The ESD protection device may further include a second highly doped region functioning as the second collector of the PNP transistor, wherein the second highly doped region may be doped with a dopant of the P-type, the second highly doped region may be formed within the second lowly doped region, and the second highly doped region may be coupled to the second node.

In another embodiment, the ESD protection device may further include a third highly doped region doped with a dopant of the P-type, wherein the third highly doped region may be formed within the first lowly doped region, and wherein the first base may be coupled to the third highly doped region.

In another embodiment, the ESD protection device may further include a third highly doped region doped with a dopant of the N-type, wherein the third highly doped region may be formed within the second lowly doped region, and wherein the second base may be coupled to the third highly doped region.

In another embodiment, the ESD protection device may further include a second PNP transistor, coupled between the first node and the NPN transistor, including a third collector, a third emitter, and a third base. The third emitter may be coupled to the first node, the third base may be coupled to the first collector, and the third collector may be coupled to the first base.

In another embodiment, the ESD protection device may further include a first lowly doped region functioning as the first base of the NPN transistor, the second emitter of the PNP transistor, and the third collector of the second PNP transistor. The first lowly doped region may be doped with a dopant of the P-type. The ESD protection device may further include a second lowly doped region functioning as the first emitter of the NPN transistor and the second base of the PNP transistor. The second lowly doped region may be doped with a dopant of the N-type, and the second lowly doped region may be formed in the first lowly doped region. The ESD protection device may further include a third lowly doped region functioning as the first collector of the NPN transistor and the third base of the second PNP transistor. The third lowly doped region may be doped with a dopant of the N-type, and the third lowly doped region may be formed in the first lowly doped region. The ESD protection device may further include a first highly doped region functioning as the second collector of the PNP transistor. The first highly doped region may be doped with a dopant of the P-type, the first highly doped region may be formed in the second lowly doped region, and the first highly doped region may be coupled to the second node. The ESD protection device may further include a second highly doped region functioning as the third emitter of the second PNP transistor. The second highly doped region may be doped with a dopant of the P-type, the second highly doped region may be formed in the third lowly doped region, and the second highly doped region may be coupled to the first node.

In another embodiment, the ESD protection device may include a second NPN transistor, coupled between the PNP transistor and the second node, including a third collector, a third emitter, and a third base. The third emitter may be coupled to the second node, the third base may be coupled to the second collector, and the third collector may be coupled to the second base.

In another embodiment, the ESD protection device may include a first lowly doped region functioning as the second base of the PNP transistor, the first emitter of the NPN transistor, and the third collector of the second NPN transistor. The first lowly doped region may be doped with a dopant of the N-type. The ESD protection device may further include a second lowly doped region functioning as the second emitter of the PNP transistor and the first base of the NPN transistor. The second lowly doped region may be doped with a dopant of the P-type, and the second lowly doped region may be formed in the first lowly doped region. The ESD protection device may further include a third lowly doped region functioning as the second collector of the PNP transistor and the third base of the second NPN transistor. The third lowly doped region may be doped with a dopant of the P-type, and the third lowly doped region may be formed in the first lowly doped region. The ESD protection device may further include a first highly doped region functioning as the third emitter of the second NPN transistor. The first highly doped region may be doped with a dopant of the N-type, the first highly doped region may be formed in the third lowly doped region, and the first highly doped region may be coupled to the second node. The ESD protection device may further include a second highly doped region functioning as the first collector of the NPN transistor. The second highly doped region may be doped with a dopant of the N-type, the second highly doped region may be formed in the second lowly doped region, and the second highly doped region may be coupled to the first node.

In another embodiment, the ESD protection device may include a first lowly doped region functioning as the first base of the NPN transistor and the second emitter of the PNP transistor. The first lowly doped region may be doped with a dopant of a P-type. The ESD protection device may further include a second lowly doped region functioning as the first emitter of the NPN transistor and the second base of the PNP transistor. The second lowly doped region may be doped with a dopant of an N-type, and the second lowly doped region may be formed in the first lowly doped region. The ESD protection device may further include a third lowly doped region functioning as the first collector of the NPN transistor. The third lowly doped region may be doped with a dopant of the N-type, and the third lowly doped region may be formed in the first lowly doped region. The ESD protection device may further include a fourth lowly doped region functioning as the second collector of the PNP transistor. The fourth lowly doped region may be doped with a dopant of the P-type, and the fourth lowly doped region may be formed within the second lowly doped region.

In another embodiment, the ESD protection device may include a first lowly doped region functioning as the first collector of the NPN transistor. The first lowly doped region may be doped with a dopant of an N-type. The ESD protection device may further include a second lowly doped region functioning as the first base of the NPN transistor and the second emitter of the PNP transistor. The second lowly doped region may be doped with a dopant of a P-type, and the second lowly doped region may be formed in the first lowly doped region. The ESD protection device may further include a third lowly doped region functioning as the first emitter of the NPN transistor and the second base of the PNP transistor. The third lowly doped region may be doped with a dopant of the N-type, and the third lowly doped region may be formed in the second lowly doped region. The ESD protection device may further include a fourth lowly doped region functioning as the second collector of the PNP transistor. The fourth lowly doped region may be doped with a dopant of the P-type, and the fourth lowly doped region may be formed in the third lowly doped region.

In another embodiment, the ESD protection device may include a first lowly doped region functioning as the second collector of the PNP transistor. The first lowly doped region may be doped with a dopant of a P-type. The ESD protection device may further include a second lowly doped region functioning as the second base of the PNP transistor and the first emitter of the NPN transistor. The second lowly doped region may be doped with a dopant of an N-type, and the second lowly doped region may be formed in the first lowly doped region. The ESD protection device may further include a third lowly doped region functioning as the second emitter of the PNP transistor and the first base of the NPN transistor. The third lowly doped region may be doped with a dopant of the P-type, and the third lowly doped region may be formed in the second lowly doped region. The ESD protection device may further include a fourth lowly doped region functioning as the first collector of the NPN transistor. The fourth lowly doped region may be doped with a dopant of the N-type, and the fourth lowly doped region may be formed in the third lowly doped region.

BRIEF DESCRIPTION OF THE DRAWINGS

A more detailed understanding may be had from the following description, given by way of example in conjunction with the accompanying drawings wherein:

FIG. 5A is a schematic diagram of an embodiment of an ESD protection device including multiple anodes.

FIG. 5B is a schematic diagram of an embodiment of an ESD protection device including multiple cathodes.

DETAILED DESCRIPTION

Figure 1:
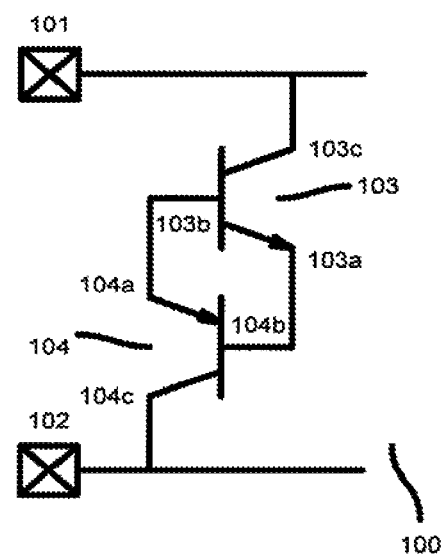
FIG. 1 is a schematic diagram of an embodiment of an ESD protection device.

In the following descriptions, common numerical designations may be used for similar, corresponding parts across multiple figures. In general, the part number will start with the figure number. For instance, NPN bipolar transistor 303 as shown in FIG. 3 corresponds to similar NPN bipolar transistor 503 shown in FIGS. 5A, 5B, and 5C. Likewise, base 203b shown in FIGS. 2A, 2B, and 2C corresponds to similar base 403b shown in FIG. 4.

One of ordinary skill in the art should recognize a node, device, circuit, or region may be viewed as serving multiple functions. Furthermore, a node, device, circuit, or region may be referred to by different descriptions. For instance, node 501 and node 502 of FIGS. 5A, 5B, and 5C may also be referred to as anode 501 and cathode 502, respectively. As another example, and ESD protection device may be interchangeably referred to as a clamp or ESD clamp. The numerical designation will provide an unambiguous notation for the node, device, circuit, or region under consideration while the preceding descriptor should aid the readability of the description in the context of the discussion.

FIG. 1 depicts a first embodiment of an ESD protection device. ESD protection device 100 comprises an NPN bipolar transistor 103 and a PNP bipolar transistor 104. NPN bipolar transistor includes at least emitter 103a, base 103b, and collector 103c. PNP bipolar transistor includes at least emitter 104a, base 104b, and collector 104c. The base 103b may be coupled to the emitter 104a and the base 104b may be coupled to the emitter 103a. In some embodiments, the base 103b may be viewed as comprising the emitter 104a, the emitter 104a may be viewed as comprising the base 103b, or the base 103b may be equivalently viewed as being the emitter 104a. In some embodiments, the base 104b may be viewed as comprising the emitter 103a, the emitter 103a may be viewed as comprising the base 104b, or the base 104b may be equivalently viewed as being the emitter 103a. The collector 103c may be coupled to the anode 101 of the ESD protection device 100 and the collector 104c is coupled to the cathode 102 of the ESD protection device 100. In some embodiments, the anode 101 may be viewed as comprising the collector 103c and the cathode 102 may be viewed as comprising the collector 104c. In other embodiments, the collector 103c may be viewed as comprising the anode 101 and the collector 104c may be viewed as comprising the cathode 102. In other embodiments, the anode 101 may be equivalently viewed as being the collector 103c and the cathode 102 may be equivalently viewed as being the collector 104c.

Throughout the description of the embodiments of ESD protection devices and the Figures depicting the embodiments of the ESD protection devices, a similar logic may be applied as that described above. Namely, wherein anodes and cathodes are depicted as being coupled to collectors, the anodes and cathodes may comprise the respective collectors, the collectors may comprise the respective anodes and cathodes, or the anodes and cathodes may be the respective collectors.

When a positive voltage is applied at the anode 101 with respect to a voltage at the cathode 102, a voltage division may occur inside the ESD protection device 100. The applied voltage may be divided across three junctions of the ESD protection device 100: the reverse collector 103c-base 103b junction, the forward base 103b-emitter 103a junction (in parallel with the forward emitter 104a-base 104b junction) and the reverse base 104b-collector 104c junction. In some embodiments, the forward base 103b-emitter 103a junction may be viewed as the same junction as the forward emitter 104a-based 104b junction. The junction with the lowest leakage may see the majority of the voltage applied across the anode and the cathode. In some embodiments, either the reverse collector 103c-base 103b junction or the reverse base 104b-collector 104c junction may have the lowest leakage for an equal voltage across each junction. The leakage of each junction may depend, for instance, on the process used to form the junction, the dopant levels of the regions that make up the junction, the dopant gradient of the junction, the shape of the well(s) contributing to the junction, and the size/geometry of the junction.

If the reverse collector 103c-base 103b junction has the lowest leakage, this junction may see the majority of the voltage applied across the anode 101 and cathode 102. When the voltage rises at the anode, the voltage over the reverse collector 103c-base 103b junction may follow until the reverse breakdown voltage of this junction is reached. Subsequently, as the anode voltage continues to rise, the remainder of the voltage may be seen over the reverse base 104b-collector 104c junction. The remainder of the voltage may rise until the reverse breakdown voltage over the base 104b-collector 104c junction is reached. Due to the emitter 104a-base 104b junction being slightly forward biased, the reverse breakdown voltage of the base 104b-collector 104c junction may be lower than it would be without the presence of the emitter 104a-base 104b junction. Also, a current flowing through the collector 103c-base 103b junction may lower the reverse breakdown voltage of the base 104b-collector 104c junction. As a result, extra emitter current may be injected into the collector 104c. This effect may enhance the current capability of the bipolar 104 and may lower the reverse breakdown voltage. This lower breakdown voltage may lower the thermal dissipation at this junction and the amount of current may be increased compared to a standard reverse junction. After breakdown of the base 104b-collector 104c reverse junction, extra emitter current may be injected in the bipolar 103 as well.

If the reverse base 104b-collector 104c junction has the lowest leakage, this junction may see the majority of the voltage applied across the anode 101 and cathode 102. When the voltage rises at the anode, the voltage over the reverse base 104b-collector 104c junction may follow until the reverse breakdown voltage of this junction is reached. Subsequently, as the anode voltage continues to rise, the remainder of the voltage may be seen over the reverse collector 103c-base 103b junction. The remainder of the voltage may rise until the reverse breakdown voltage over the collector 103c-base 103b junction is reached. Due to the base 103b-emitter 103a junction being slightly forward biased, the reverse breakdown voltage over the collector 103c-base 103b junction may be lower than it would be without the presence of the base 103b-emitter 103a junction. Also, a current flowing through the base 104b-collector 104c junction may lower the reverse breakdown voltage of the collector 103c-base 103b junction. As a result, extra emitter current may be injected into the collector 103c. This effect may enhance the current capability of the bipolar 103 and may lower the reverse breakdown voltage. This lower breakdown voltage may lower the thermal dissipation at this junction and the amount of current may be increased compared to a standard reverse junction. After breakdown of the collector 103c-base 103b reverse junction, extra emitter current may be injected in the bipolar 104 as well.

As described previously although the base 103b-emitter 103a junction and the emitter 104a-base 104b are depicted as 2 junctions in FIG. 1, they may be a single junction. Throughout the embodiments depicted in the Figures and described in the following text, similar arrangements of parallel base-emitter/emitter-base junctions may be implemented as a single junction. Furthermore, a depiction of 3 or more base-emitter/emitter-base junctions in parallel may be implemented as 1 or more fewer than the junctions depicted in the Figures. For instance, an embodiment depicted as including 3 parallel base-emitter junctions may be implemented with 2 base-emitter junctions or 1 base-emitter junction. It is further possible for any of the depicted embodiments of ESD protection devices to be implemented with more junctions than depicted in the Figures.

The particular dopant types of the transistors depicted in FIG. 1 and described above, i.e. the arrangement of the NPN 103 and the PNP 104, should not be swapped to use a corresponding PNP and NPN to avoid early triggering and unwanted latch-up. By changing the N and P dopant types, a parasitic silicon controlled rectifier (SCR) may be formed.

Figure 2A:
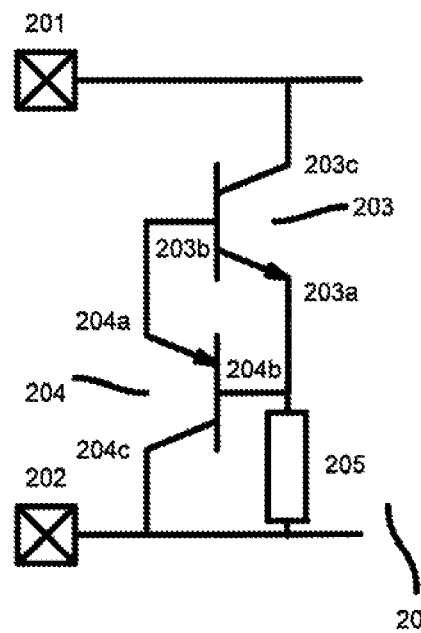
FIG. 2A is a schematic diagram of an embodiment of an ESD protection device including a first implementation of a control circuit.
Figure 2B:
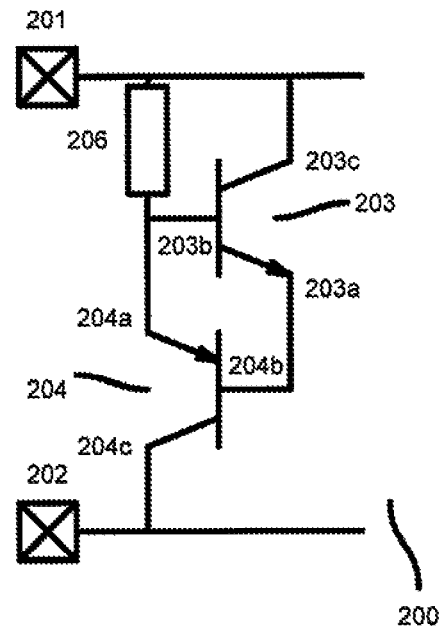
FIG. 2B is a schematic diagram of an embodiment of an ESD protection device including a second implementation of a control circuit.
Figure 2C:
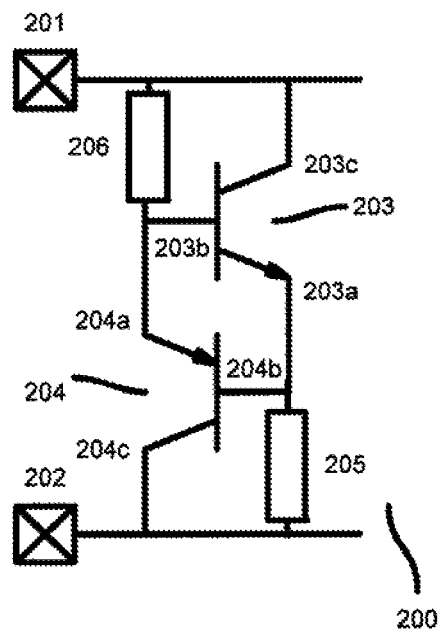
FIG. 2C is a schematic diagram of an embodiment of an ESD protection device including a third implementation of a control circuit.

FIGS. 2A, 2B and 2C depict ESD protection device 200 including 3 possible implementations of a control circuit 205 and/or control circuit 206. The depicted control circuit may function as a biasing element to influence the performance of the ESD protection device. By coupling the control circuit 205 in parallel with the reverse junction 204b-204c and/or by coupling the control circuit 206 in parallel with the reverse junction 203c-203b, two parameters may be influenced. The leakage could be increased, so that the designer can control which junction will go into breakdown first and as such control the trigger voltage of the ESD protection circuit 200. This could be desirable since the reverse breakdown voltage could be different for the 203c-203b than for the 204b-204c junction. Also, by adding the control circuit the voltage at which current may flow through the ESD protection device 200 can be reduced. The control circuits allow the ESD protection device 200 to turn on in a high current mode without requiring both junctions to be in reverse breakdown.

A possible implementation of control circuit 205/206 includes: a resistor, a resistive connection, an inductor, a capacitor, a reverse junction, a forward junction, an NMOS, a PMOS, a bipolar transistor, or any combination thereof. Any element or combination of elements that may influence the leakage at the node or the voltage at which current may flow through the ESD protection device 200 may be applied.

Figure 3A:
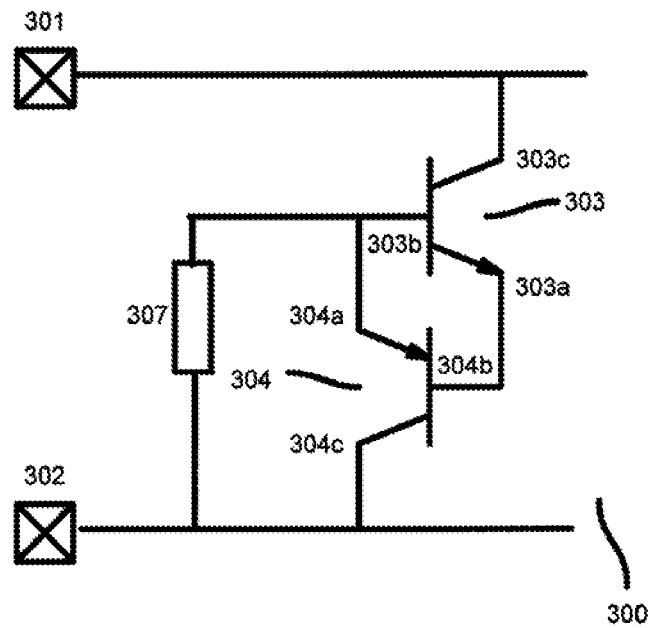
FIG. 3A is a schematic diagram of an embodiment of an ESD protection device including a fourth implementation of a control circuit.
Figure 3B:
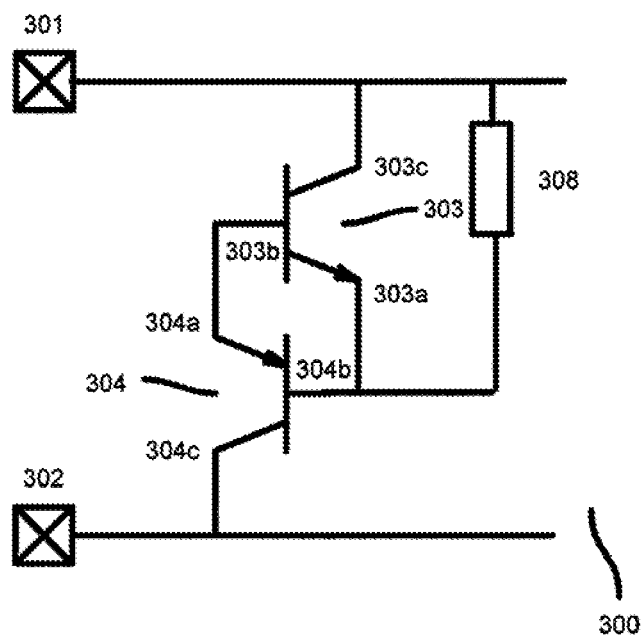
FIG. 3B is a schematic diagram of an embodiment of an ESD protection device including a fifth implementation of a control circuit.
Figure 3C:
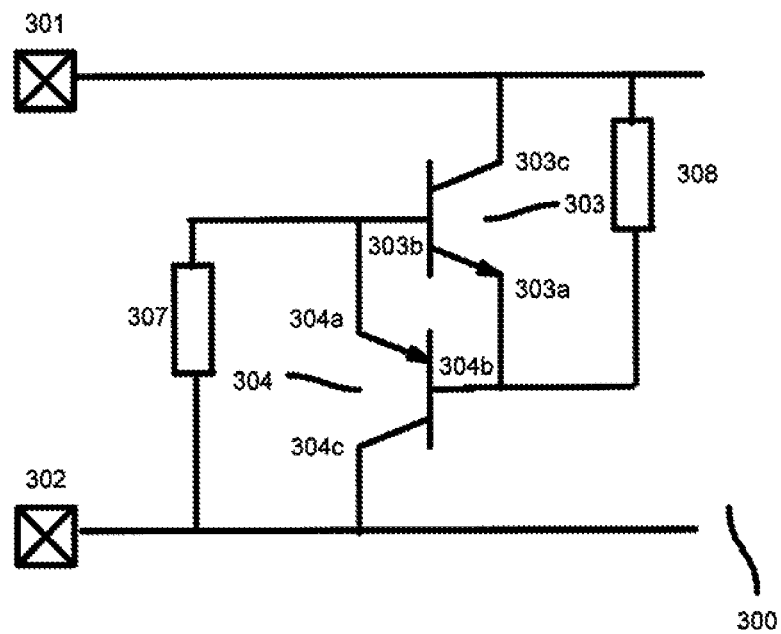
FIG. 3C is a schematic diagram of an embodiment of an ESD protection device including a sixth implementation of a control circuit.

Alternative ways to couple the control circuit are shown in FIG. 3A, FIG. 3B and FIG. 3C. Instead of coupling control circuit 205 in parallel with the reverse junction 204b-204c, the control circuit 307 may be coupled in parallel with the series combination of the reverse junction 304b-304c and the forward junction 304a-304b as depicted in FIGS. 3A and 3C. One may alternatively or additionally view the control circuit 307 as being coupled in parallel with the series combination of the reverse junction 304b-304c and the forward junction 303b-303a. As previously described, although forward junction 304a-304b and forward junction 303b-303a are depicted as 2 junctions, they may be implemented as a single junction. Similarly, instead of coupling control circuit 206 in parallel with the reverse junction 203c-203b, the control circuit 308 may be coupled in parallel with the series combination of the reverse junction 303c-303b and the forward junction 303b-303a. One may alternatively or additionally view the control circuit 308 as being coupled in parallel with the series combination of the reverse junction 303c-303b and the forward junction 304a-304b. As previously described, although forward junction 303b-303a and forward junction 304a-304b are depicted as 2 junctions, they may be implemented as a single junction. An advantage of these embodiments may be to control the trigger current of the ESD protection device. The impedance of the additional control circuit may act as a biasing element and may determine the amount of current it sinks before the parallel bipolar goes into breakdown and/or while the associated bipolar conducts current.

A possible implementation of the control circuit 307 and/or 308 may include: a resistive connection, a resistor, an inductor, a capacitor, a reverse junction, a forward junction, an NMOS, a PMOS, a bipolar transistor, or any combination thereof. Any element that may influence the leakage at the node or the voltage at which current may flow through the ESD protection device 300 could be applied.

Figure 4:
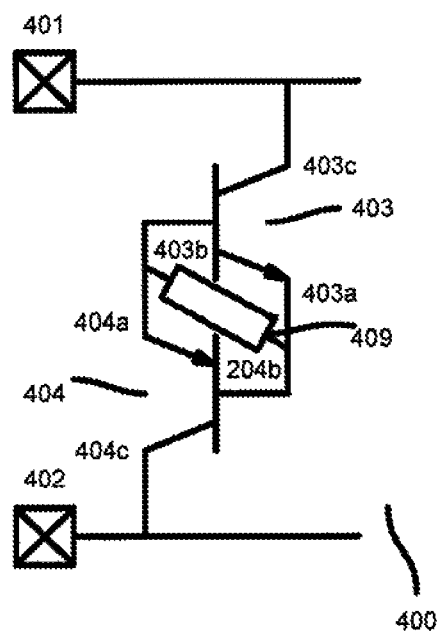
FIG. 4 is a schematic diagram of an embodiment of an ESD protection device including a bias circuit.

FIG. 4 shows an embodiment of an ESD protection device with a bias circuit 409. To turn on bipolar transistor 403 and bipolar transistor 404, the base emitter junction of the respective bipolar transistor must be forward biased. As previously described, FIG. 4 depicts two base-emitter junctions however the ESD protection device may also be implemented with a single base-emitter junction. The voltage needed to forward bias the junction is determined by the built-in voltage of the diode formed by the junction. In standard CMOS this may be around 0.7-0.8 V. Triggering the ESD protection device can be delayed by placing a bias circuit 409 in parallel with these base-emitter junctions. The bias circuit may conduct more current than the base-emitter junction at a voltage below the built-in voltage of the base-emitter junction. The effect is that more trigger current may be needed to properly bias the reverse junctions 403c-403b and/or 404b-404c for the bipolar transistors to enter a high current mode.

A possible implementation of bias circuit 409 includes: a resistor, a resistive connection, an inductor, a capacitor, a reverse junction, a forward junction, an NMOS, a PMOS, a bipolar transistor, or any combination thereof. Any element or combination of elements that may influence the leakage at the node or the voltage where current at which current may flow through the ESD protection device 400 could be applied.

Figure 5C:
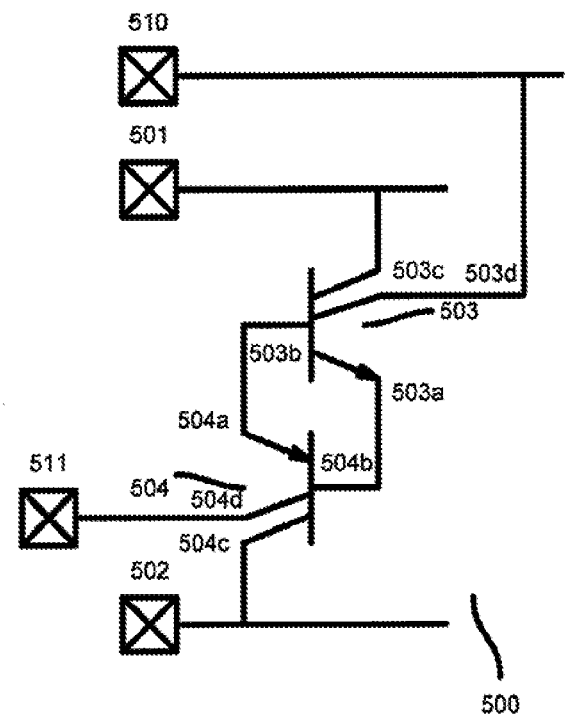
FIG. 5C is a schematic diagram of an embodiment of an ESD protection device including multiple anodes and multiple cathodes.

FIG. 5A depicts an embodiment of an ESD protection device 500 including an additional anode 510 coupled to an additional collector 503d. FIG. 5B depicts an embodiment of an ESD protection device 500 including an additional cathode 511 coupled to an additional collector 504d. FIG. 5C depicts an embodiment of an ESD protection device 500 including both an additional anode 510 coupled to an additional collector 503d and an additional cathode 511 coupled to an additional collector 504d. As similarly previously described, anode 510 may alternatively be viewed as comprising collector 503d, collector 503d may be viewed as comprising anode 510, or anode 510 may be equivalently viewed as also being the collector 503d. Further, as similarly previously described, cathode 511 may alternatively be viewed as comprising emitter 504d, emitter 504d may be viewed as comprising cathode 511, or cathode 511 may be equivalently viewed as also being the emitter 504d.

The additional anode 510 depicted in FIG. 5A could be coupled to the node 501 or to a different node than node 501. If it is coupled to a different node, protection may be provided from anode 501 to cathode 502 and protection from anode 510 to cathode 502. The area of this implementation may be smaller than the area if 2 separate ESD protection devices are used. Alternatively, anode 510 could be coupled to anode 501, which may enhance the total current capability of the ESD protection device. Note that the extra collector 503d could be an intended or a parasitic collector due to the process requirements. In some embodiments, as similarly previously described, the additional anodes and additional cathodes could be viewed as comprising the additional collectors.

In addition, a bias signal at node 510 during normal operation may affect the trigger and/or holding voltage or the trigger and/or holding current of the ESD protection device 500 between nodes 501 and 502.

The additional cathode 511 in FIG. 5B could be coupled to node 502 or to a different node than node 502. If it is coupled to a different node, protection may be provided from anode 501 to cathode 502 and provided from anode 501 to cathode 511. The area of this implementation may be smaller than the area if 2 separate ESD protection devices are used. Alternatively, cathode 511 could be coupled to cathode 502. This may enhance the total current capability of the ESD protection device. Note that the extra collector 504d could be an intended or a parasitic collector due to the process requirements. In some embodiments, the additional anodes and additional cathodes could be viewed as comprising the additional respective collectors, the additional collectors could be viewed as comprising the additional respective anodes and cathodes, or the additional anodes and cathodes could be viewed as being the additional respective collectors.

In addition, a bias signal at node 511 during normal operation may affect the trigger and/or holding voltage or the trigger and/or holding current of the ESD protection device 500 between nodes 501 and 502.

In FIG. 5C the additional cathode 511 could be coupled to node 502 or to a different node than node 502. If it is coupled to a different node, protection may be provided from anode 501 to cathode 502 and provided from anode 501 to cathode 511. The area of this implementation may be smaller than the area if 2 separate ESD protection devices are used. Alternatively, cathode 511 could be coupled to cathode 502, which may enhance the total current capability of the ESD protection device. Note that the extra collector 504d could be an intended or a parasitic collector due to the process requirements. The additional anode 510 could be coupled to node 501 or to a different node than node 501. If it is coupled to a different node, protection will be provided from anode 501 to cathode 502 and provided from anode 510 to cathode 502. The area of this implementation may be smaller than the area if 2 separate ESD protection devices are used. Alternatively, anode 510 could be coupled to anode 501, which may enhance the total current capability of the ESD protection device. Note that the extra collector 503d could be an intended or a parasitic collector due to the process requirements. In some embodiments, the additional anodes and additional cathodes could be viewed as comprising the additional respective collectors, the additional collectors could be viewed as comprising the additional respective anodes and cathodes, or the additional anodes and cathodes could be viewed as being the additional respective collectors.

In addition, a bias signal at node 510 and/or node 511 during normal operation may affect the trigger and/or holding voltage or the trigger and/or holding current of the ESD protection device 500 between nodes 501 and 502.

Figure 6A:
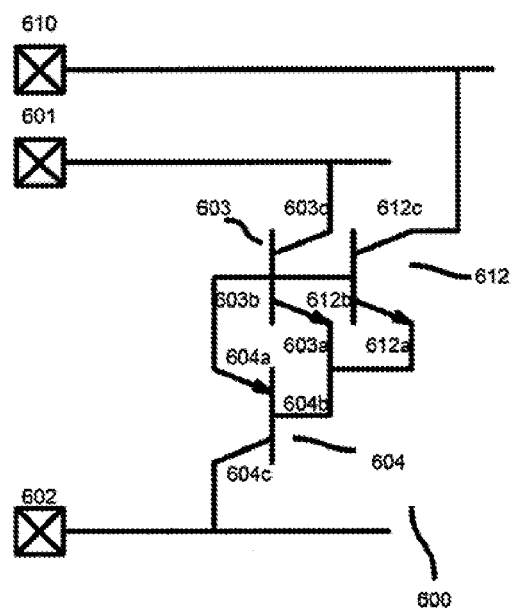
FIG. 6A is a schematic diagram of another embodiment of an ESD protection device including multiple anodes.
Figure 6B:
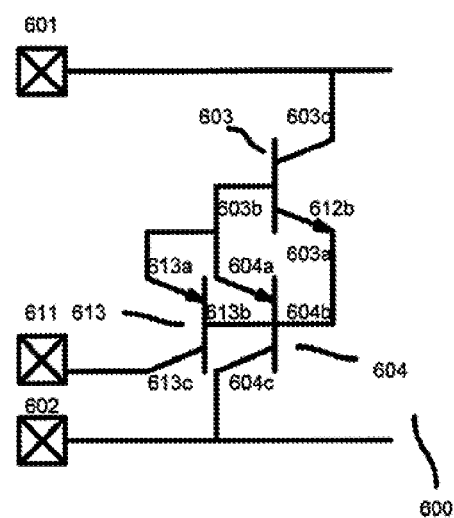
FIG. 6B is a schematic diagram of another embodiment of an ESD protection device including multiple cathodes.
Figure 6C:
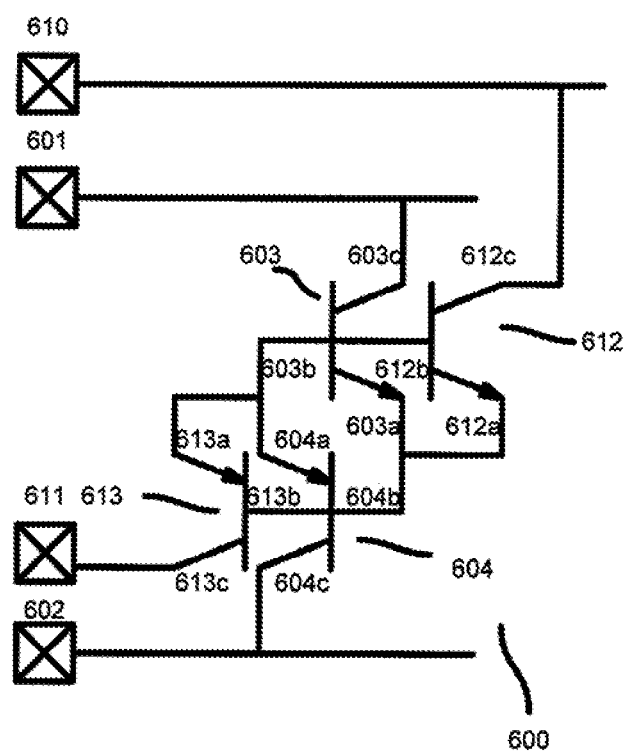
FIG. 6C is a schematic diagram of another embodiment of an ESD protection device including multiple anodes and multiple cathodes.

FIG. 6A, FIG. 6B and FIG. 6C depict additional embodiments of an ESD protection device 600 including additional bipolar transistors. A second NPN bipolar transistor 612 and/or a second PNP bipolar transistor 613 could be added. Similar operation applies for FIG. 6A, FIG. 6B, and FIG. 6C as described for FIG. 5A, FIG. 5B and FIG. 5C, respectively.

Note that coupling of an additional bipolar 612 and bipolar 613 might be done through additional elements (not shown in the Figures) at emitter and/or base in order to control the current/voltage distribution through/over the different bipolar transistors and bipolar junctions. For example, an embodiment of an ESD protection device may comprise additional well resistance between the emitter 612*a* and the emitter 603*a*. Another example of an embodiment of an ESD protection device may include additional well resistance between the base 612*b* and the base 603*b*. One should recognize a similar principle of incorporating additional elements between any bases and between any emitters of an ESD protection device may be applied to control current/voltage distribution. Further, the aforementioned additional elements may not be limited to well resistance. Any element which may influence the distribution of current/voltage may be used. An example of an additional element may include a resistor, a diode, a MOS device, a resistive connection, bipolar transistor, etc.

Figure 7A:
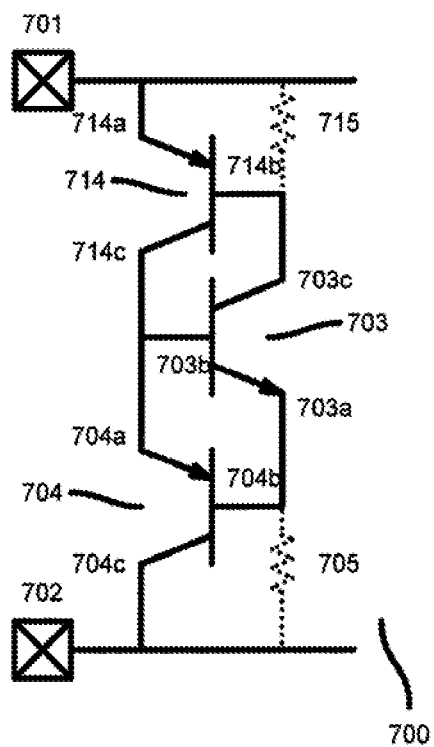
FIG. 7A is a schematic diagram of an embodiment of an ESD protection device configured in a stacked arrangement.

Additional circuitry could be coupled in series with an embodiment of the ESD protection circuit. For example, in FIG. 7A, a PNP bipolar transistor 714 is coupled between the anode 701 and bipolar transistor 703. As depicted in FIG. 7A, the base 714*b* may be coupled to the collector 703*c*, the collector 714*c* may be coupled to the base 703*b* and/or emitter 704*a*, and the emitter 714*a* may be coupled to the anode 701. As similarly previously described, the emitter 714*a* may comprise the anode 701, the anode 701 may comprise the emitter 714*a*, or the anode 701 may be the emitter 714*a*. Extra current could be injected in the base 703*b* and emitter 703*a* of bipolar transistor 703 and the base 704*b* and emitter 704*a* of bipolar transistor 704. This may have an influence on the voltage at which reverse breakdown occurs. Additionally, leakage, holding voltage/current, and/or trigger current may be influenced. Additional element 705 may be coupled between base 704*b*/emitter 703*a* and cathode 702. Furthermore, additional element 715 may be coupled between anode 701 and base 714*b*/collector 703*c*. Although FIG. 7A depicts additional elements 705 and 715 as resistors, elements 704 and 715 may also be implemented as: a resistive connection, an inductor, a capacitor, a reverse junction, a forward junction, an NMOS, a PMOS, a bipolar transistor, or any combination thereof. Any element or combination of elements that may influence the leakage at the node or the voltage where current will flow could be applied.

Figure 7B:
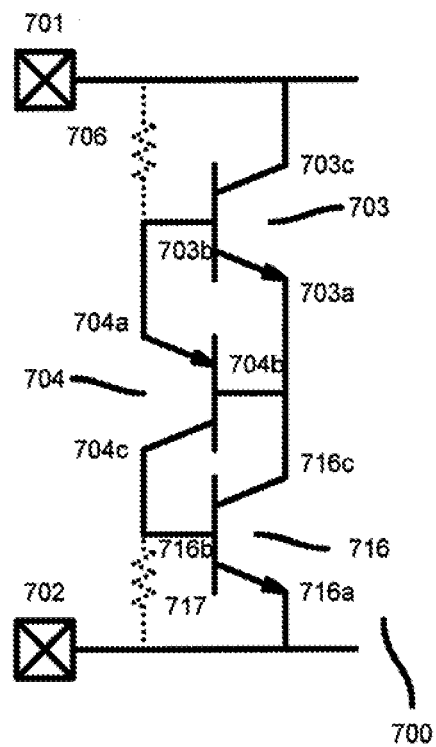
FIG. 7B is a schematic diagram of an embodiment of an ESD protection device configured in another stacked arrangement.

An NPN bipolar transistor 716 could be coupled between the cathode 702 and the bipolar transistor 704 as shown by way of example in FIG. 7B. Extra current could be injected in the base 703*b* and emitter 703*a* of bipolar transistor 703 and the base 704*b* and emitter 704*a* of bipolar transistor 704. This may have an influence on the voltage at which reverse breakdown occurs. Additionally, leakage, holding voltage/current, and/or trigger current may be influenced. Additional element 706 may be coupled between base 703*b*/emitter 704*a* and anode 701. Furthermore, additional element 717 may be coupled between cathode 702 and base 716*b*/collector 704*c*. Although FIG. 7B depicts additional elements 706 and 717 as resistors, elements 706 and 717 may also be implemented as: a resistive connection, an inductor, a capacitor, a reverse junction, a forward junction, an NMOS, a PMOS, a bipolar transistor, or any combination thereof. Any element or combination of elements that may influence the leakage at the node or the voltage where current will flow could be applied.

Figure 7C:
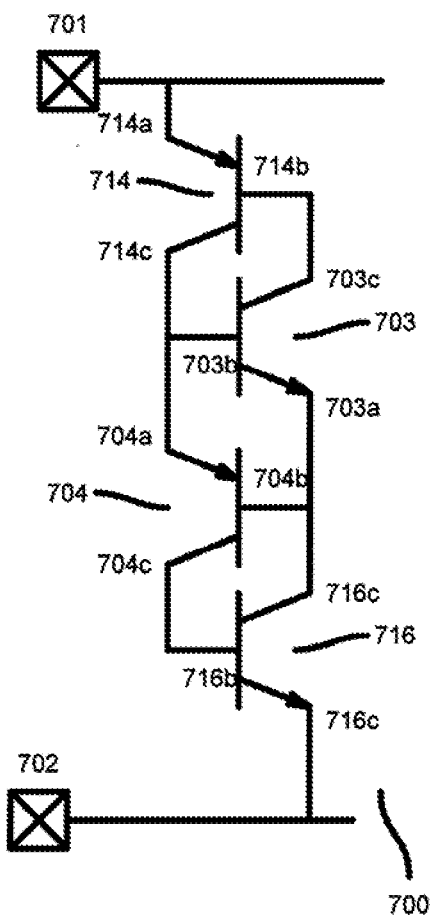
FIG. 7C is a schematic diagram of an embodiment of an ESD protection device configured in another stacked arrangement.

The number of additional bipolar transistors may be extended than as depicted, for instance, in FIGS. 7A and 7B. FIG. 7C depicts an example embodiment of an ESD protection device including a PNP transistor 714 and an NPN transistor 716. The PNP transistor 714 may be coupled between the anode 701 and the bipolar transistor 703. As shown in FIG. 7C, the emitter 714*a* may be coupled to anode 701, the base 714*b* may be coupled to collector 703*c*, and the collector 714*c* may be coupled to base 703*b*/emitter 704*a*. The NPN transistor 716 may be coupled between the cathode 702 and the bipolar transistor 704. As shown in FIG. 7C, the emitter 716*a* may be coupled to the cathode 702, base 716*b* may be coupled to collector 704*c*, and collector 716*c* may be coupled to base 704*b*/emitter 703*a*. As similarly previously described, one of ordinary skill in the art should recognize an ESD protection device in accordance with the example embodiment shown in FIG. 7C—and similarly for any embodiments of an ESD protection device included in this disclosure or in accordance with the teachings of this disclosure—may be formed such that more or fewer wells, regions, junctions, etc. may be used to implement the ESD protection device and portions thereof. For instance, emitter 714*a* may act as anode 701 or emitter 714*a* may be a region separate from and coupled to the anode 701. As another example, a single region may be used to act as collector 716*c*, base 704*b*, and emitter 703*a*.

Figure 7D:
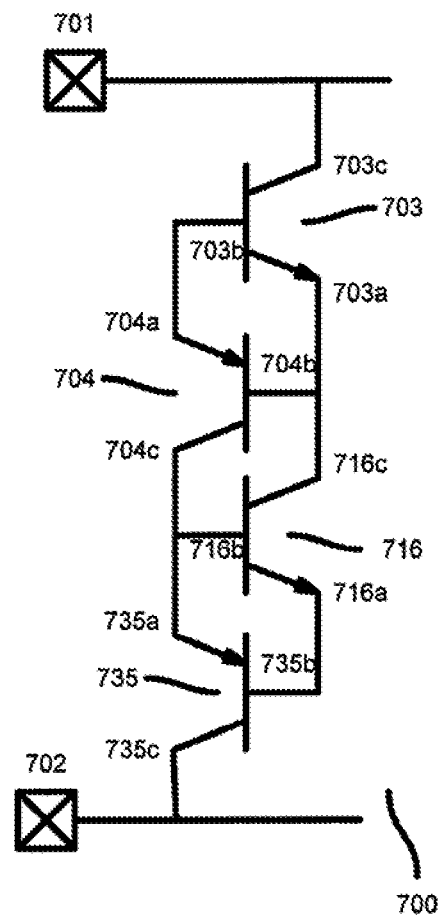
FIG. 7D is a schematic diagram of an embodiment of an ESD protection device configured in another stacked arrangement.

FIG. 7D depicts an example embodiment of an ESD protection device including a PNP transistor 735 and an NPN transistor 716. PNP transistor 735 may be coupled between cathode 702 and the NPN transistor 716. As shown in FIG. 7D, emitter 735*a* may be coupled to base 716*b*/collector 704*c*, base 735*b* may be coupled to emitter 716*a*, and collector 735*c* may be coupled to cathode 702. Note that NPN transistor 716 and PNP transistor 735 form a similar structure as the exemplary ESD protection device 100 depicted in FIG. 1. Again, as similarly mentioned before, though the description and depiction of the circuit diagram of the exemplary ESD protection device in 7D describes elements of the ESD protection device as being coupled to each other, one of ordinary skill in the art should recognize an implementation of the device may include a single region functioning as a plurality of the depicted elements coupled together, a region functioning as a first element may comprise a region functioning as a second element which is depicted as being coupled to the first element, and a single element may be implemented by a plurality of regions.

FIGS. 7E-7J depict additional embodiments of ESD protection devices including additional bipolar transistors. Throughout the exemplary embodiments depicted in FIGS. 7E-7J, additional transistors may be added at the anode and/or cathode side of the ESD protection device such that the type of bipolar, i.e. NPN vs. PNP, is switched for each consecutive bipolar added to the ESD protection device.

Figure 7E:
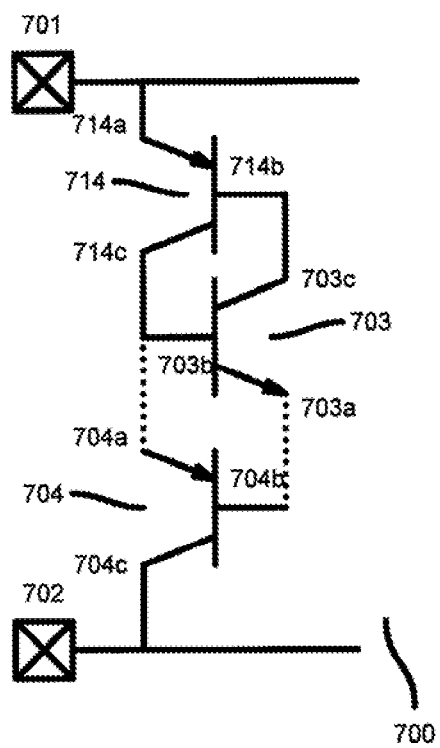
FIG. 7E is a schematic diagram of an embodiment of an ESD protection device configured in another stacked arrangement.

FIG. 7E depicts an exemplary embodiment of an ESD protection device 700 wherein additional bipolar transistors may be added to the anode side of the ESD protection device. FIG. 7E depicts PNP transistor 714 added to the anode side, but additional transistors (not depicted) may be added, as described above, by switching the type of the transistor for each consecutive transistor. Following this logic, a chain of consecutively coupled additional transistors may be added into the dotted region depicted in FIG. 7E, such that the type of each additional transistor switches and the top additional transistor of the chain coupled to PNP transistor 714 may be an NPN transistor (not depicted) and the bottom additional transistor of the chain coupled to the NPN transistor 703 may be a PNP transistor (not depicted). In this way, the type of each transistor included in the total chain of transistors between anode 701 and cathode 702 switches type for each consecutive transistor. Note that in the exemplary embodiment depicted in FIG. 7E, a PNP transistor such as PNP transistor 714 may be the top transistor of the total chain and a PNP transistor such as PNP transistor 704 may be the bottom transistor of the total chain.

Figure 7F:
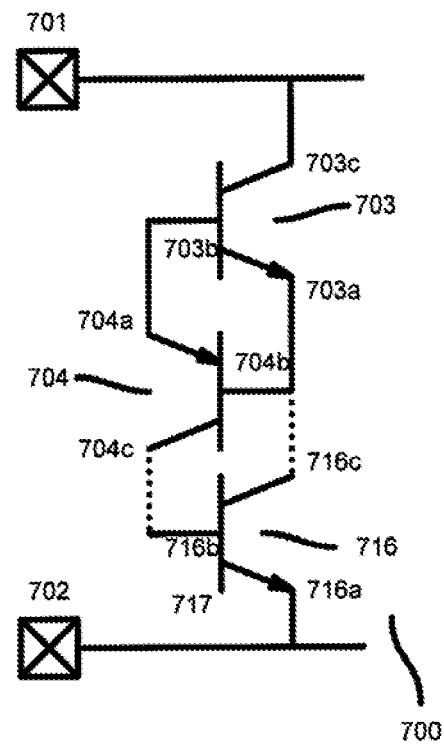
FIG. 7F is a schematic diagram of an embodiment of an ESD protection device configured in another stacked arrangement.

FIG. 7F depicts an exemplary embodiment of an ESD protection device 700 wherein additional bipolar transistors may be added to the cathode side of the ESD protection device. FIG. 7F depicts NPN transistor 716 added to the cathode side, but additional transistors (not depicted) may be added, as described above, by switching the type of the transistor for each consecutive transistor. Following this logic, a chain of consecutively coupled additional transistors may be added into the dotted region depicted in FIG. 7F, such that the type of each additional transistor switches and the top additional transistor of the chain coupled to PNP transistor 704 may be an NPN transistor (not depicted) and the bottom additional transistor of the chain coupled to the NPN transistor 716 may be a PNP transistor (not depicted). In this way, the type of each transistor included in the total chain of transistors between anode 701 and cathode 702 switches type for each consecutive transistor. Note that in the exemplary embodiment depicted in FIG. 7F, an NPN transistor such as NPN transistor 703 may be the top transistor of the total chain and an NPN transistor such as NPN transistor 716 may be the bottom transistor of the total chain.

Figure 7G:
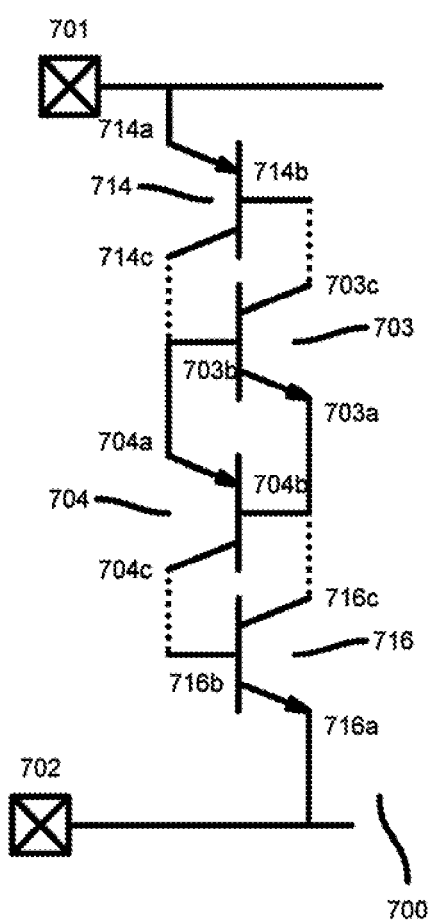
FIG. 7G is a schematic diagram of an embodiment of an ESD protection device configured in another stacked arrangement.

FIG. 7G depicts an exemplary embodiment of an ESD protection device 700 wherein additional bipolar transistors may be added to the anode side and to the cathode side of the ESD protection device. FIG. 7G depicts PNP transistor 714 added to the anode side, but additional transistors (not depicted) may be added, as described above, by switching the type of the transistor for each consecutive transistor. FIG. 7G depicts NPN transistor 716 added to the cathode side, but additional transistors (not depicted) may be added, as described above, by switching the type of the transistor for each consecutive transistor. Following this logic, as similarly described for the embodiments shown in FIGS. 7E and 7F, a chain of consecutively coupled additional transistors may be added into the dotted regions depicted in FIG. 7G, such that the type of each transistor included in the total chain of transistors between anode 701 and cathode 702 switches type for each consecutive transistor. Note that in the exemplary embodiment depicted in FIG. 7G, a PNP transistor such as PNP transistor 714 may be the top transistor of the total chain and an NPN transistor such as NPN transistor 716 may be the bottom transistor of the total chain.

Figure 7H:
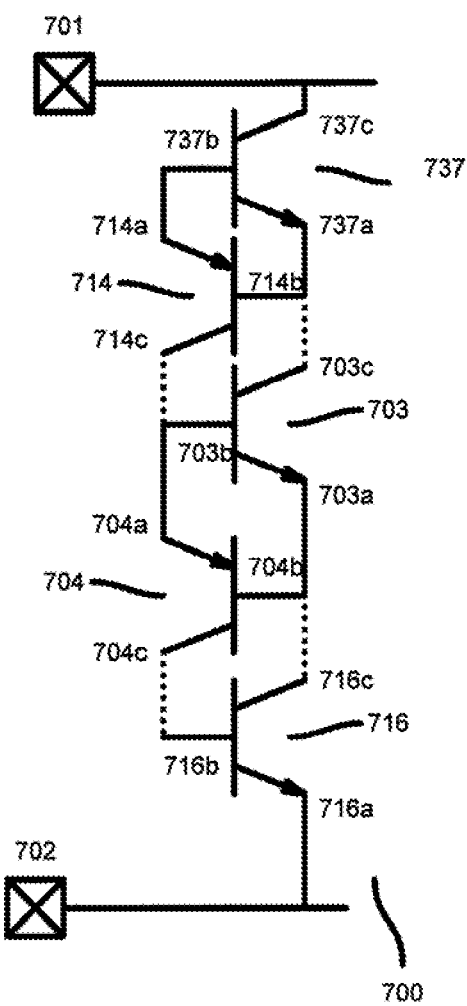
FIG. 7H is a schematic diagram of an embodiment of an ESD protection device configured in another stacked arrangement.

FIG. 7H depicts another exemplary embodiment of an ESD protection device 700 wherein additional bipolar transistors may be added to the anode side and to the cathode side of the ESD protection device. The arrangement of the total chain of transistors between the anode 701 and the cathode 702 follows the same principles as described above. Note that in the exemplary embodiment depicted in FIG. 7H, an NPN transistor such as NPN transistor 737 may be the top transistor of the total chain and an NPN transistor such as NPN transistor 716 may be the bottom transistor of the total chain.

Figure 7I:
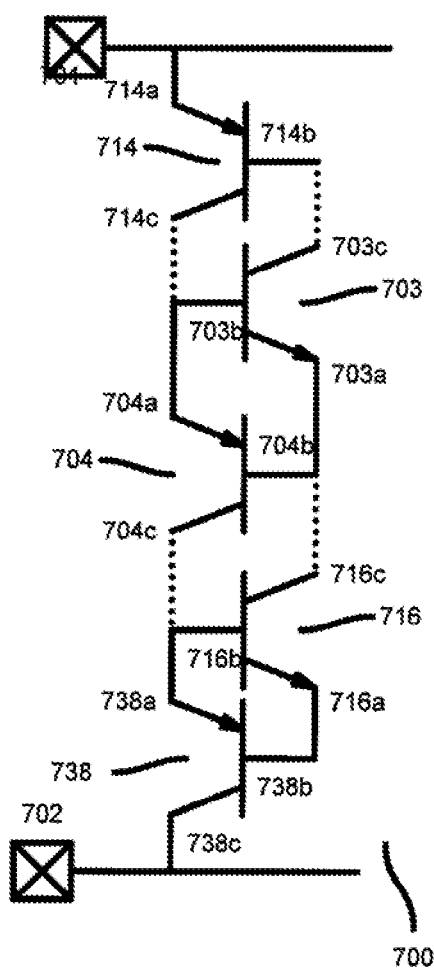
FIG. 7I is a schematic diagram of an embodiment of an ESD protection device configured in another stacked arrangement.

FIG. 7I depicts yet another exemplary embodiment of an ESD protection device 700 wherein additional bipolar transistors may be added to the anode side and to the cathode side of the ESD protection device. The arrangement of the total chain of transistors between the anode 701 and the cathode 702 follows the same principles as described above. Note that in the exemplary embodiment depicted in FIG. 7I, a PNP transistor such as PNP transistor 714 may be the top transistor of the total chain and a PNP transistor such as PNP transistor 738 may be the bottom transistor of the total chain.

Figure 7J:
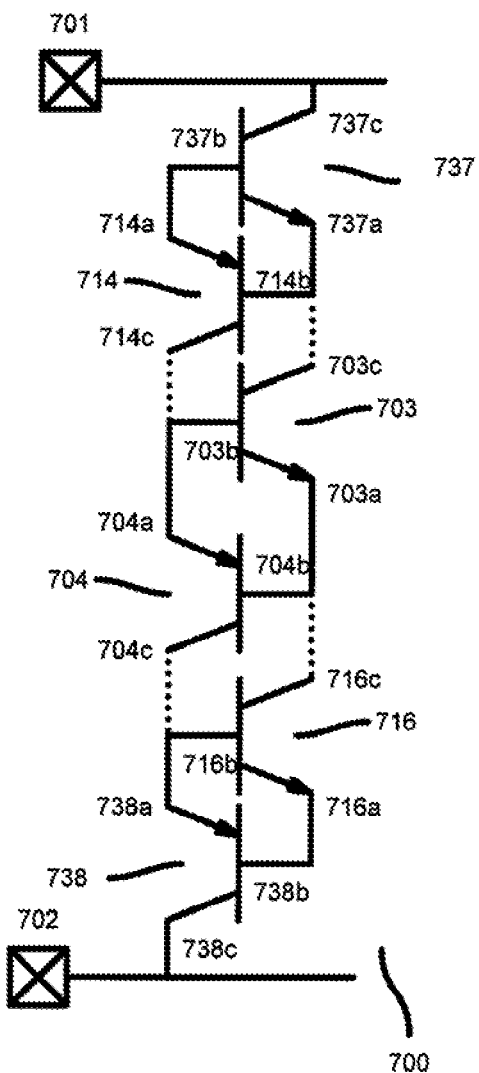
FIG. 7J is a schematic diagram of an embodiment of an ESD protection device configured in another stacked arrangement.

FIG. 7J depicts yet another exemplary embodiment of an ESD protection device 700 wherein additional bipolar transistors may be added to the anode side and to the cathode side of the ESD protection device. The arrangement of the total chain of transistors between the anode 701 and the cathode 702 follows the same principles as described above. Note that in the exemplary embodiment depicted in FIG. 7J, an NPN transistor such as NPN transistor 737 may be the top transistor of the total chain and a PNP transistor such as PNP transistor 738 may be the bottom transistor of the total chain.

Figure 8:
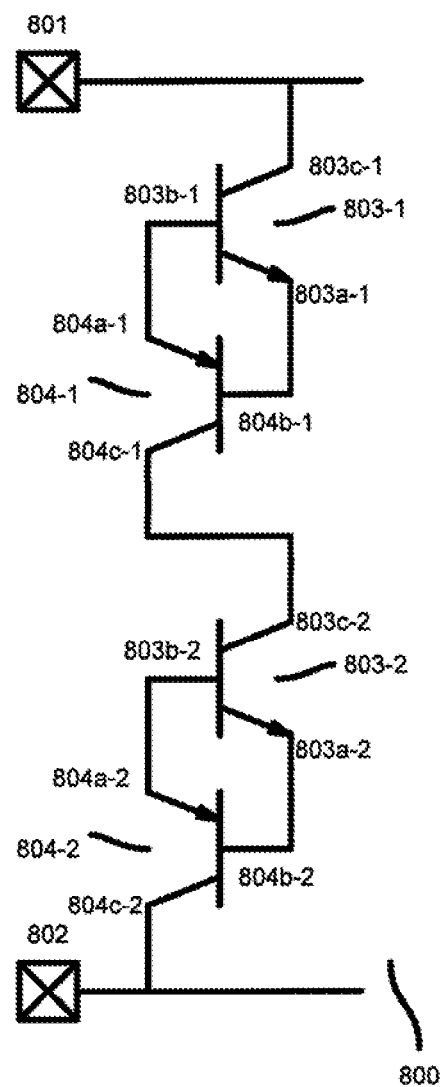
FIG. 8 is a schematic diagram of an embodiment of an ESD protection device configured in yet another stacked arrangement.

One or more ESD protection devices may be stacked to achieve a higher clamping voltage. FIG. 8 shows an example of a stack of 2 ESD protection devices, but note that any number of devices could be used. Also, FIG. 8 depicts NPN transistor 803-1 and NPN transistor 803-2, which may be constructed with the same type of junctions. FIG. 8 further depicts PNP transistor 804-1 and PNP transistor 804-2, which may be constructed with the same type of junctions. However, it is also possible to form transistors with at least one different type of junction. Furthermore, different embodiments of the ESD protection device, such as those depicted and described throughout this disclosure, can be used within one stack.

Figure 9:
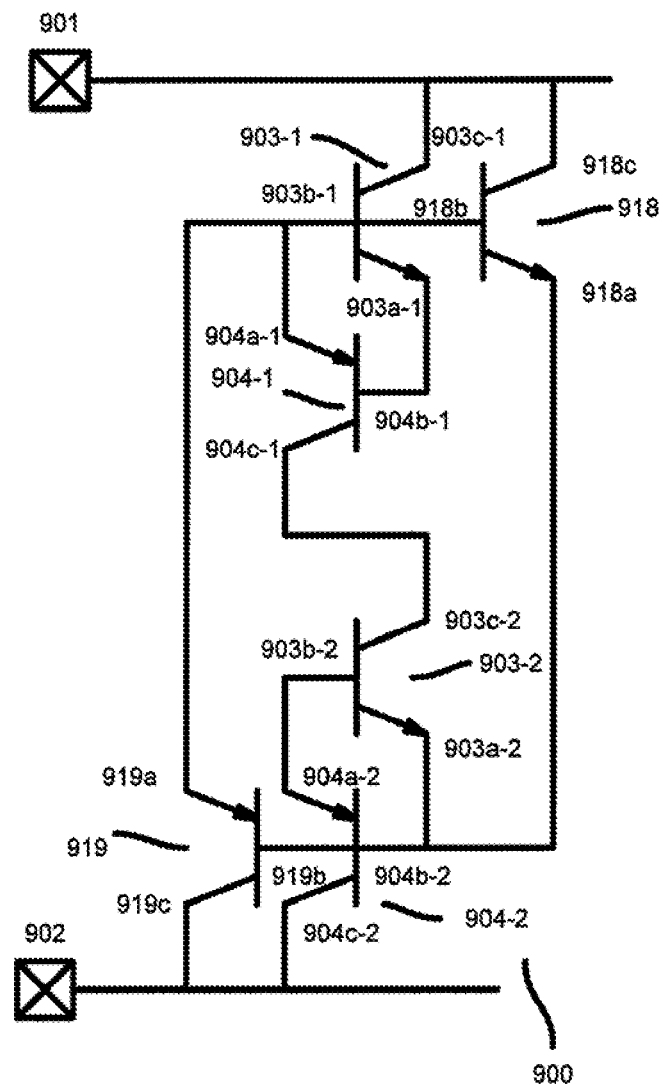
FIG. 9 is a schematic diagram of an embodiment of an ESD protection device configured in yet another stacked arrangement.
Figure 10:
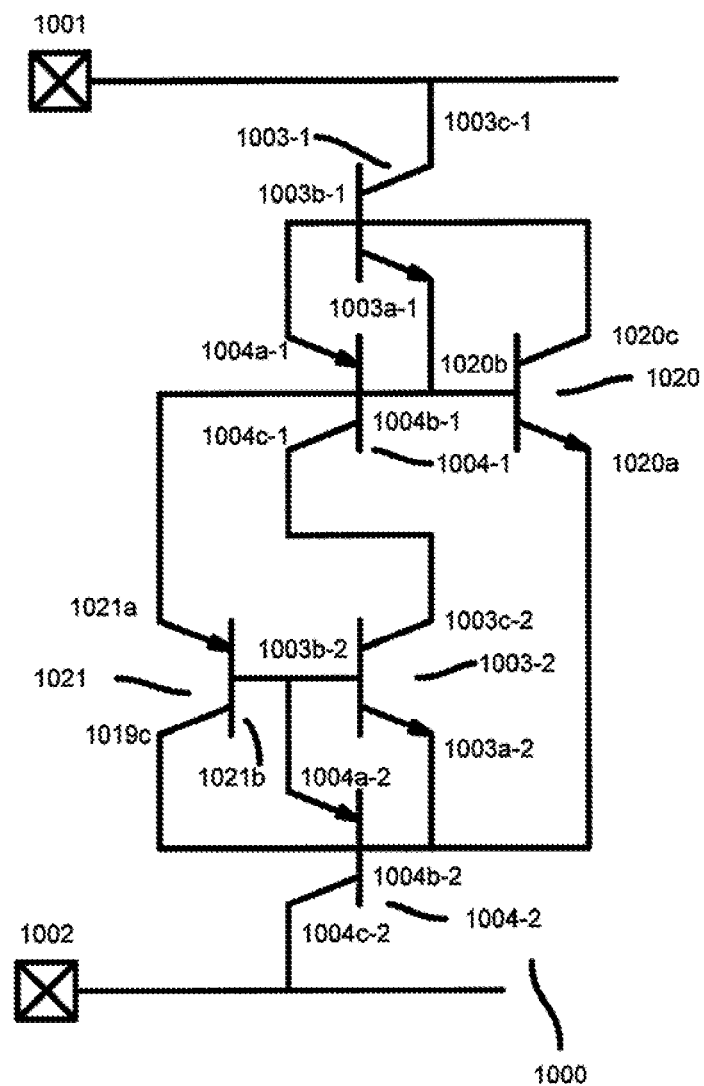
FIG. 10 is a schematic diagram of an embodiment of an ESD protection device configured in yet another stacked arrangement.

FIG. 9 and FIG. 10 show stacked embodiments of ESD protection devices including some possible extra parasitic devices inside the respective structures. The bipolar transistors included in the exemplary ESD protection devices may be isolated from the substrate. As such, exemplary parasitic bipolar transistors 919 and 918 in FIG. 9 and exemplary parasitic bipolar transistors 1020 and 1021 in FIG. 10 may be formed by and/or between the regions of the stacked ESD protection devices and the isolation junction(s).

Figure 11:
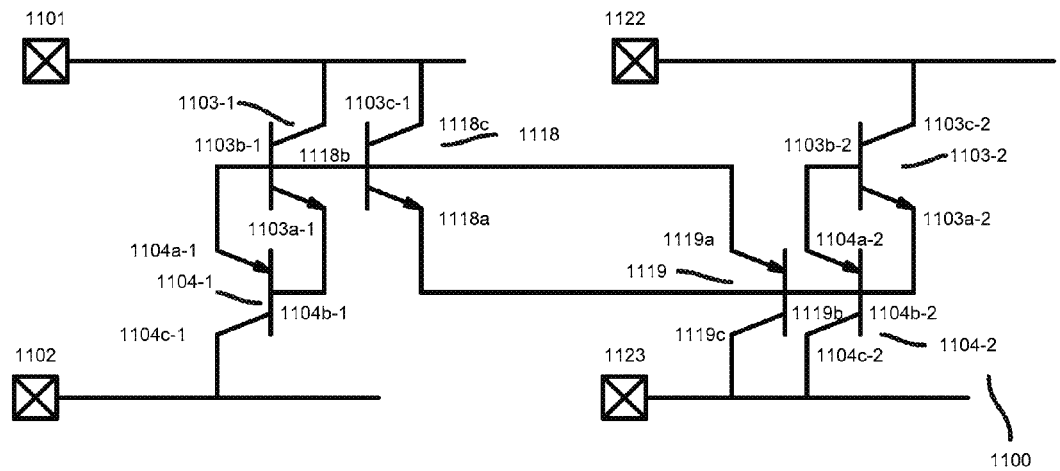
FIG. 11 is a schematic diagram of an embodiment of a multi-pin ESD protection device.

FIG. 11 shows an embodiment of an ESD protection device similar to FIG. 9. As shown, the collector 1104c-1 and collector 1103c-2 may be coupled to two external nodes 1102 and 1122 rather than coupled together as similarly shown in FIG. 9. By coupling collectors 1104c-1 and 1103-2 to different nodes, additional implementations may be possible. For instance, additional devices may be coupled between nodes 1102 and 1122 to increase the clamping voltage. In another example, the ESD protection device 1100 may provide ESD protection between nodes 1101 and 1102 and between nodes 1122 and 1123. Additionally, ESD protection may be provided between nodes 1101 and 1123, which may be useful for inter-domain protection.

The devices depicted in FIG. 1 to FIG. 11 could be implemented with standalone bipolar transistors such that each emitter, base, and collector of each transistor is formed by its own individual region, or they can be merged in a compact structure sharing, for instance, regions or the base-emitter junction of the NPN transistor and the PNP transistor. FIG. 12 to FIG. 19 depict different possible layouts for implementing ESD protection devices. Note that the ESD protection circuits depicted in the Figures are exemplary. Other implementations which fall within the spirit or scope of the general disclosure are possible and should be recognized by one of ordinary skill in the art.

Figure 12:
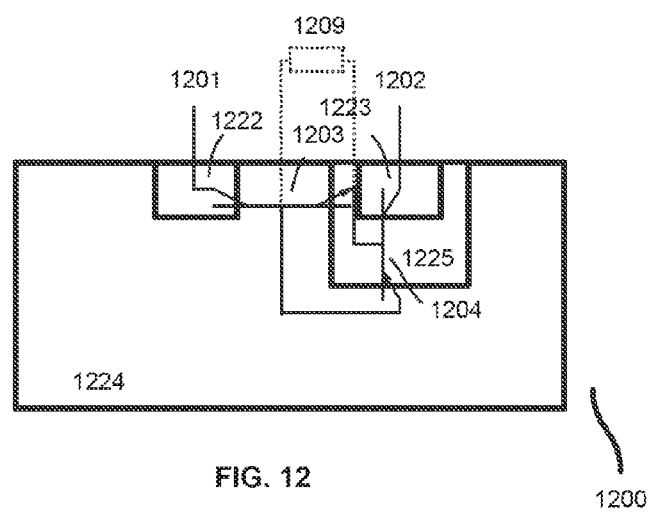
FIG. 12 is a cross-section diagram of a possible implementation of an ESD protection device.

FIG. 12 shows a cross section of an exemplary semiconductor structure 1200 of an ESD protection device such as ESD protection device 100 depicted in FIG. 1. By way of example, the collector 103*c* may be formed by a highly doped region 1222 of a first dopant type, for instance an N-type dopant. Region 1222 may be formed within a lowly doped region 1224 of a second dopant type, for instance a P-type dopant. The base 103*b* may be formed by the lowly doped region 1224. The emitter 103*a* may be formed by a lowly doped region 1225 of the first dopant type inside the lowly doped region 1224. The lowly doped region 1224 may also function as the emitter 104*a* and the lowly doped region 1225 may also function as base 104*b*. The collector 104*c* may be formed by a highly doped region 1223 of the second dopant type inside the lowly doped region 1225. The lowly doped region 1224 may or may not completely surround the lowly doped region 1225 such that the lowly doped region 1225 may or may not be completely within the lowly doped region 1224. The lowly doped region 1225 may or may not completely surround the highly doped region 1223 such that the highly doped region 1223 may or may not be completely within the lowly doped region 1225. Also, the lowly doped region 1224 may or may not completely surround the highly doped region 1222 such that the highly doped region 1222 may or may not be completely within the lowly doped region 1224. The first and the second dopant type may be n and p doped, respectively. In some embodiments, region 1222 may additionally function as the anode 1201 (similarly as the anode 101 of FIG. 1) and region 1223 may additionally function as the cathode 1202 (similarly as the cathode 102 of FIG. 1).

Figure 13:
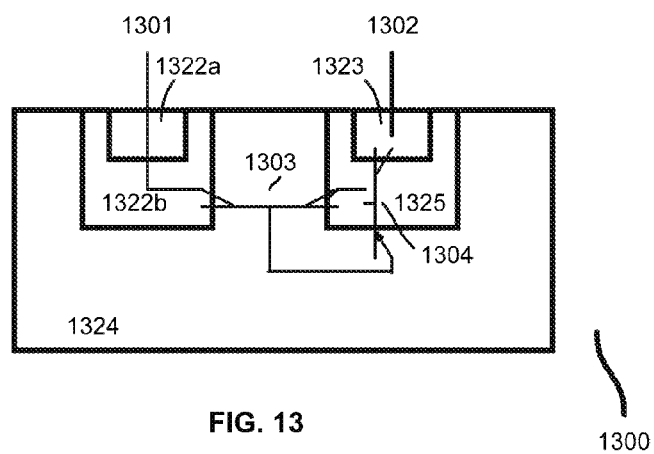
FIG. 13 is a cross-section diagram of another possible implementation of an ESD protection device.

FIG. 13 shows a cross section of an exemplary semiconductor structure 1300 similar to the semiconductor structure 1200 depicted in FIG. 12. Semiconductor structure 1300 further includes an additional lowly doped region 1322*b* of the first dopant type, e.g. N-type, surrounding the highly doped region 1322*a* of the first dopant type. In this way, highly doped region 1322*a* may be formed in lowly doped region 1322*b*. Note that the lowly doped region 1324 may or may not completely surround the lowly doped region 1322*b* such that lowly doped region 1322*b* may or may not be completely within lowly doped region 1324. Note also that the lowly doped region 1322*b* may or may not completely surround the highly doped region 1322*a* such that highly doped region 1322*a* may or may not be completely within lowly doped region 1322*b*. Although the lowly doped regions 1325 and 1322*b* are depicted with the same depth, the depth or shape of these regions could be formed differently.

One should recognize that for all Figures shown, each single region of N or P type could be the combination of multiple N or P regions.

Figure 14:
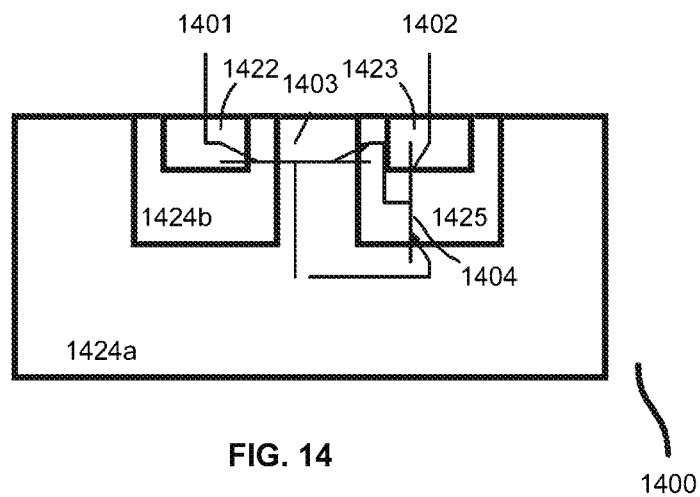
FIG. 14 is a cross-section diagram of yet another possible implementation of an ESD protection device.

FIG. 14 shows a cross section of an exemplary semiconductor structure 1400 similar to the semiconductor structure 1200 depicted in FIG. 12. Semiconductor structure 1400 further includes an additional lowly doped region 1424*b* of the second dopant type, e.g. P-type, surrounding the highly doped region 1422 of the first dopant type. In this way, highly doped region 1422 may be formed in lowly doped region 1424*b*. Note that the lowly doped region 1424*a* of the second dopant type may or may not completely surround the lowly doped region 1424*b* such that lowly doped region 1424*b* may or may not be completely within lowly doped region 1424*a*. Note also that the lowly doped region 1424*b* may or may not completely surround the highly doped region 1422 such that highly doped region 1422 may or may not be completely within lowly doped region 1424*b*. Although the lowly doped regions 1425 and 1424*b* are depicted with the same depth, the depth or shape of these regions could be formed differently.

Figure 15:
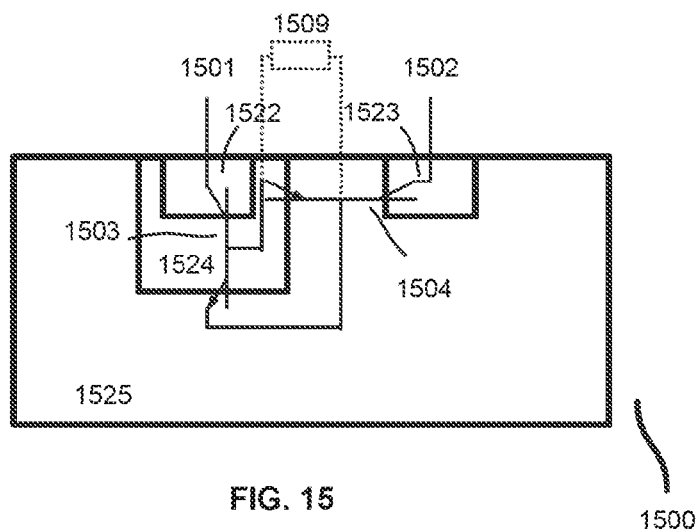
FIG. 15 is a cross-section diagram of yet another possible implementation of an ESD protection device.

FIG. 15 shows a cross section of another exemplary semiconductor structure 1500 of an ESD protection device such as ESD protection device 100 depicted in FIG. 1. The collector 103*c* may be formed by a highly doped region 1522 of a first dopant type, for instance, an N-type. The base 103*b* may be formed by a lowly doped region 1524 of a second dopant type, for instance, a P-type. The lowly doped region 1524 may surround the highly doped region 1522. The emitter 103*a* may be formed by a lowly doped region 1525 of the first dopant type surrounding the lowly doped region 1524 of the second dopant type. The lowly doped region 1524 may also function as the emitter 104*a* and the lowly doped region 1525 may also function as the base 104*b*. The collector 104*c* may be formed by a highly doped region 1523 of the second dopant type inside the lowly doped region 1525. Note that the lowly doped region 1525 may or may not completely surround the lowly doped region 1524 such that the lowly doped region 1524 may or may not be completely within lowly doped region 1525. Note also that the lowly doped region 1525 may or may not completely surround the highly doped region 1523 such that highly doped region 1523 may or may not be completely within lowly doped region 1525. Note also that the lowly doped region 1524 may or may not completely surround the highly doped region 1522 such that the highly doped region 1522 may or may not be completely within lowly doped region 1524. The first and the second dopant type may be n and p doped, respectively. In some embodiments, region 1522 may additionally function as the anode 1501 (similarly as the anode 101 of FIG. 1) and region 1523 may additionally function as the cathode 1502 (similarly as the cathode 102 of FIG. 1).

Figure 16:
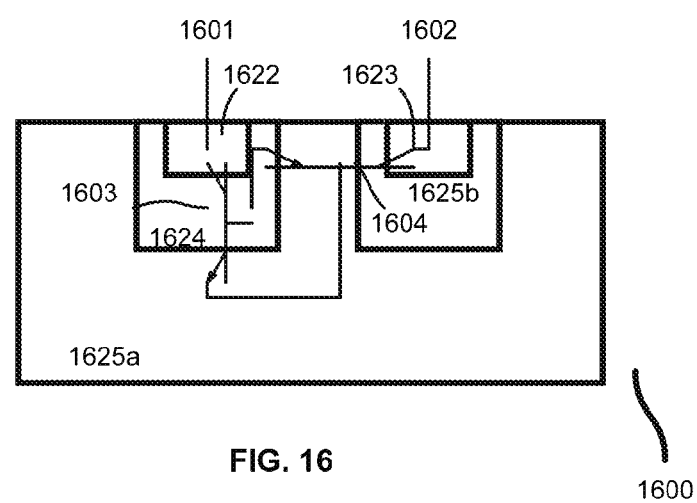
FIG. 16 is a cross-section diagram of yet another possible implementation of an ESD protection device.

FIG. 16 shows a cross section of an exemplary semiconductor structure 1600 similar to the semiconductor structure 1500 depicted in FIG. 15. Semiconductor structure 1600 further includes a lowly doped region 1625*b* of the first dopant type, e.g. N-type, surrounding the highly doped region 1623. Note that the lowly doped region 1625*a* may or may not completely surround the lowly doped region 1625*b* such that lowly doped region 1625*b* may or may not be completely within lowly doped region 1625*a*. Note also that the lowly doped region 1625*b* may or may not completely surround the highly doped region 1623 such that highly doped region 1623 may or may not be completely within lowly doped region 1625*b*. Although the lowly doped regions 1624 and 1625*b* are depicted with the same depth, the depth or shape of these regions could be formed differently.

Figure 17:
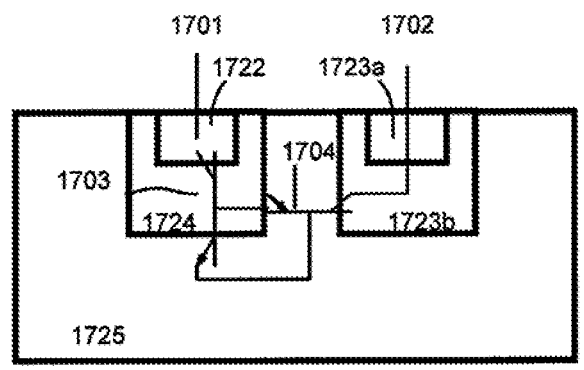
FIG. 17 is a cross-section diagram of yet another possible implementation of an ESD protection device.

FIG. 17 shows a cross section of an exemplary semiconductor structure 1700 similar to the semiconductor structure 1500 depicted in FIG. 15. Semiconductor structure 1700 further includes an additional lowly doped region 1723*b* of the second dopant type, e.g. P-type, surrounding the highly doped region 1723*a*. Note that the lowly doped region 1725 may or may not completely surround the lowly doped region 1723*b* such that lowly doped region 1723*b* may or may not be completely within lowly doped region 1725. Note also that the lowly doped region 1723*b* may or may not completely surround the highly doped region 1723*a* such that highly doped region 1723*a* may or may not be completely within lowly doped region 1723*b*. Although lowly doped regions 1724 and 1723*b* are depicted with the same depth, the depth or shape of these regions could be formed differently.

Figure 18:
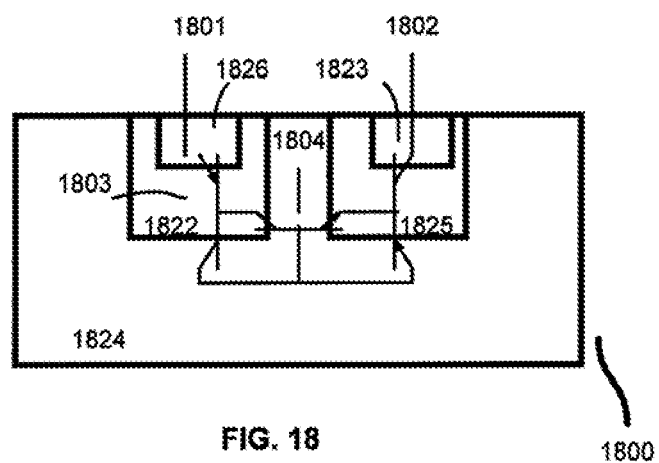
FIG. 18 is a cross-section diagram of a possible implementation of the ESD protection device depicted in FIG. 7A.

FIG. 18 shows a cross section of an exemplary semiconductor structure 1800 of an ESD protection device such as ESD protection device 700 depicted in FIG. 7A. By way of example, the collector 703c of FIG. 7A may be formed by a lowly doped region 1822 of a first dopant type, for instance an N-type dopant. Region 1822 may be formed within a lowly doped region 1824 of a second dopant type, for instance a P-type dopant. The base 703b of FIG. 7A may be formed by the lowly doped region 1824. The emitter 703a of FIG. 7A may be formed by a lowly doped region 1825 of the first dopant type inside the lowly doped region 1824. The lowly doped region 1824 may also function as the emitter 704a of FIG. 7A and the lowly doped region 1825 may also function as base 704b of FIG. 7A. The collector 704c of FIG. 7A may be formed by a highly doped region 1823 of the second dopant type inside the lowly doped region 1825 of the first dopant type. The emitter 714a of FIG. 7A may be formed by a highly doped region 1826 of the second dopant type inside the lowly doped region 1822. The lowly doped region 1822 may also function as base 714b of FIG. 7A and the lowly doped region 1824 may also act as collector 714c of FIG. 7A. Note that the lowly doped region 1824 may or may not completely surround the lowly doped region 1825 such that lowly doped region 1825 may or may not be completely within lowly doped region 1824. Note also that the lowly doped region 1825 may or may not completely surround the highly doped region 1823 such that the highly doped region 1823 may or may not be completely within lowly doped region 1825. Note also that the lowly doped region 1824 may or may not completely surround the lowly doped region 1822 such that the lowly doped region 1822 may or may not be completely within lowly doped region 1824. Note also that the lowly doped region 1822 may or may not completely surround the highly doped region 1826 such that highly doped region 1826 may or may not be completely within lowly doped region 1822. The first and the second dopant type may be n and p doped, respectively. In some embodiments, region 1826 may additionally function as the anode 1801 (similarly as the anode 701 of FIG. 7A) and region 1823 may additionally function as the cathode 1802 (similarly as the cathode 702 of FIG. 7A).

Figure 19:
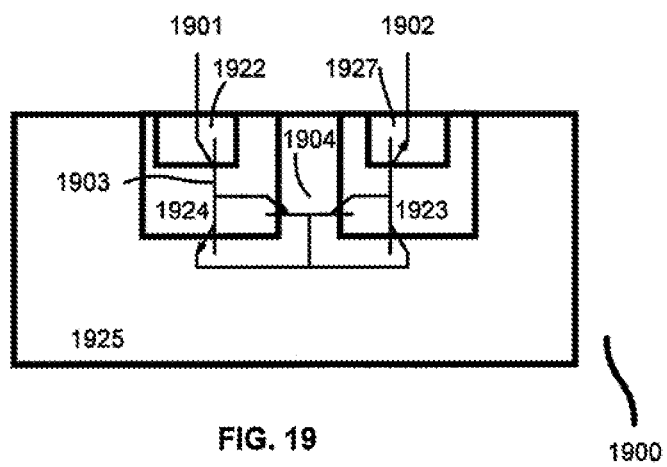
FIG. 19 is a cross-section diagram of a possible implementation of the ESD protection device depicted in FIG. 7B.

FIG. 19 shows a cross section of an exemplary semiconductor structure 1900 of an ESD protection device such as ESD protection device 700 depicted in FIG. 7B. The collector 703c of FIG. 7B may be formed by a highly doped region 1922 of a first dopant type, for instance an N-type. The highly doped region 1922 of the first dopant type may be formed in a lowly doped region 1924 of a second dopant type, for instance a P-type. The base 703b of FIG. 7B may be formed by the lowly doped region 1924. The emitter 703a of FIG. 7B may be formed by a lowly doped region 1925 of the first dopant type surrounding the lowly doped region 1924. The lowly doped region 1924 may also function as the emitter 704a of FIG. 7B and the lowly doped region 1925 may also function as the base 704b of FIG. 7B. The collector 704c of FIG. 7B may be formed by a lowly doped region 1923 of the second dopant type inside the lowly doped region 1925. The emitter 716a of FIG. 7B may be formed by a highly doped region 1927 of the first dopant type inside the lowly doped region 1923. The lowly doped region 1923 may also function as the base 716b of FIG. 7B and the lowly doped region 1924 may also act as collector 716c of FIG. 7B. Note that the lowly doped region 1924 may or may not completely surround the highly doped region 1922 such that the highly doped region 1922 may or may not be completely within lowly doped region 1924. Note also that the lowly doped region 1925 may or may not completely surround the lowly doped region 1923 such that lowly doped region 1923 may or may not be completely within lowly doped region 1925. Note also that the lowly doped region 1925 may or may not completely surround the lowly doped region 1924 such that lowly doped region 1924 may or may not be completely within lowly doped region 1925. Note also that the lowly doped region 1923 may or may not completely surround the highly doped region 1927 such that highly doped region 1927 may or may not be completely within lowly doped region 1923. The first and the second dopant type may be n and p doped, respectively. In some embodiments, region 1922 may additionally function as the anode 1901 (similarly as the anode 701 of FIG. 7B) and region 1927 may additionally function as the cathode 1902 (similarly as the cathode 702 of FIG. 7B).

Figure 20:
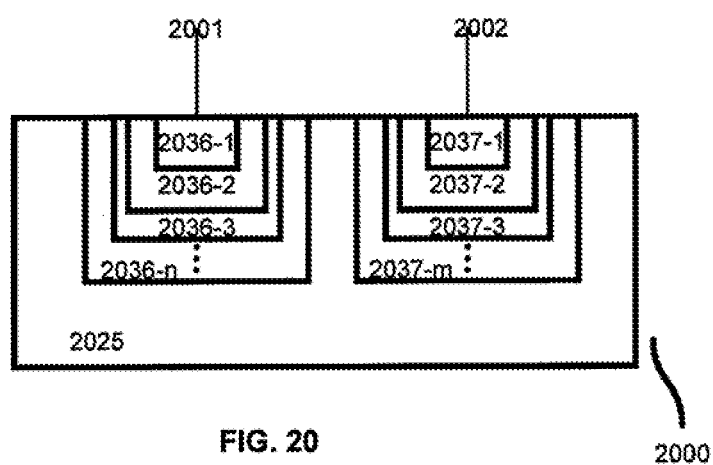
FIG. 20 is a cross-section diagram of a general implementation of an ESD protection device.

FIG. 20 depicts a cross section of a general semiconductor structure by which the ESD protection devices depicted in FIGS. 7C to 7J may be implemented. At least an integer number "n" wells 2036-1 to 2036-n may be formed in the region 2025. Node 2001, connected to well 2036-1, may function as the anode and as such region 2036-1 may function as the anode. At least an integer number "m" wells 2037-1 to 2037-m may be formed in the region 2025. Node 2002, connected to well 2037-1, may function as the cathode and as such region 2037-m may function as the cathode. As similarly previously described for the exemplary embodiments of ESD protection devices depicted in FIGS. 7C to 7J, consecutive transistors in the transistor chains should be of opposite type. As such, consecutive wells of wells 2036-1 to 2036-n may have opposite dopant types (n or p doped). Likewise, consecutive wells of wells 2037-1 to 2027-n may have opposite dopant types. Each well or region depicted in FIG. 20 may be highly or lowly doped.

As described above, for instance, in reference to FIGS. 2A, 2B, and 2C, additional control circuits may be added such as control circuits 205 and 206 depicted in FIG. 2C. Similar control circuits may be included in any embodiment of an ESD protection device in accordance with the teachings herein. For example, control circuits may be implemented in the semiconductor structures depicted in the cross sections of FIGS. 12 to 20. To implement control circuits connected to a base, one or more highly doped regions may be added inside the wells which may function as the base of the transistor to which it is connected. The added well(s) functioning as the control circuit(s) may be of the same dopant type, i.e. P-type or N-type, as the well in which they are formed. The highly doped region forming the control circuit may include a stripe in the base well of the same dopant type as the base well. Alternatively, the control circuit well may be implemented, for example, as a ring (when viewed from above) around the anode and/or the cathode inside the well functioning as the respective transistor base.

It may be useful to isolate the ESD protection devices from the substrate. This can be done to prevent the formation of unwanted parasitic or to allow stacking of different devices. By way of example, FIG. 21 and FIG. 22 show possible ways to isolate the devices from the substrate.

Figure 21:
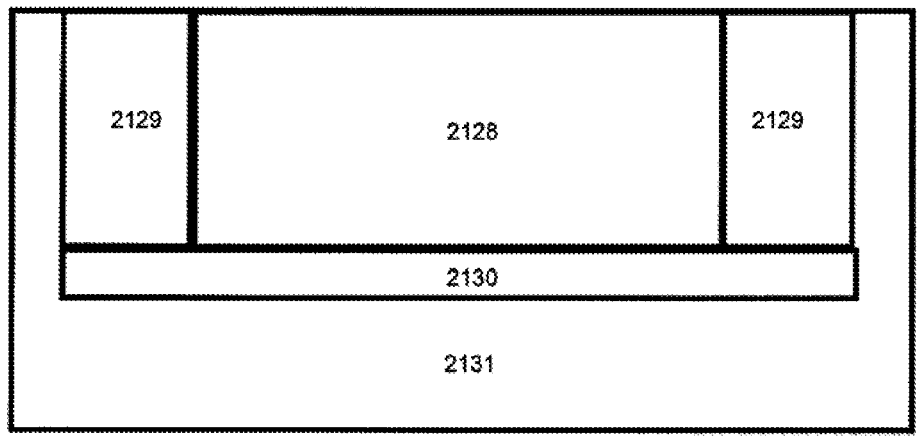
FIG. 21 is a cross-section diagram of a first possible isolation for use with an ESD protection device.

FIG. 21 shows a cross section of a first example of isolation which may be used in conjunction with any embodiment of an ESD protection device. The device 2128 may comprise, for example, any of the devices depicted in FIG. 12 to FIG. 20. A ring 2129 may be formed around the device 2128. Note that FIG. 21 is a cross section view, hence ring 2129 is depicted as two regions, but may be a single ring when viewed from above. Also a buried layer 2130 may be placed beneath at least a portion of the device 2128 and/or the ring region(s) 2129. Such a configuration may isolate the device 2128 from the substrate 2131. The regions 2129 and 2130 may be of a first dopant type, for example N-type, and region 2131 may be of a second dopant type opposite of the first dopant type, for example P-type.

Figure 22:
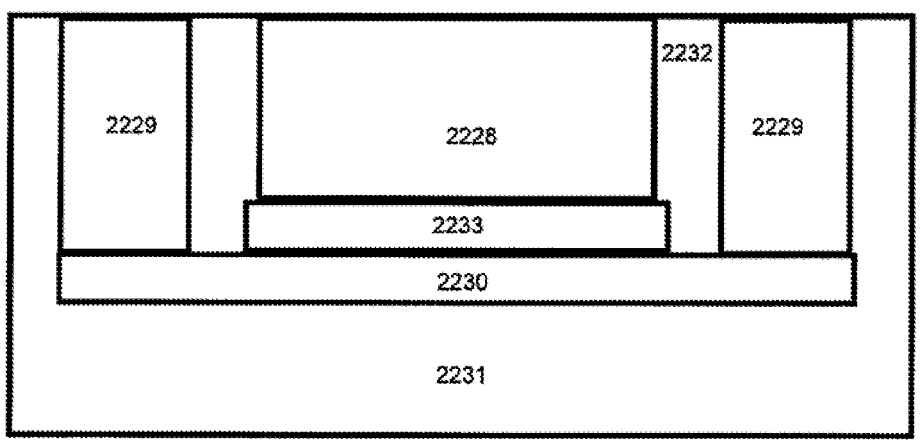
FIG. 22 is a cross-section diagram of a second possible isolation for use with an ESD protection device.

FIG. 22 shows a cross section of a second example of isolation which may be used in conjunction with any embodiment of an ESD protection device. The device 2228 may comprise, for example, any of the ESD protection devices depicted in FIG. 12 to FIG. 20. A first ring 2229 may be formed around the device 2228. Note that FIG. 22 is a cross section view, hence ring 2229 is depicted as two regions, but may be a single ring when viewed from above. Also a first buried layer 2230 may be placed beneath at least a portion of the device 2228 and/or the region(s) 2229. A second ring 2232 may be formed between at least a portion of the first ring 2229 and the device 2228, and a second buried layer 2233 may be formed between at least a portion of the device 2228 and the first buried layer 2230. Such a configuration may isolate the device 2228 from the substrate 2231. The regions 2229 and 2230 may be of the first dopant type, for example N-type, and the regions 2231, 2233 and 2232 may be of the second dopant type, for example P-type.

The isolation techniques described above are only 2 examples, other techniques known by those skilled in the art could also be implemented. For instance, in processes like silicon-on-insulator (SOI), isolation can be done using oxide layers.

It should be recognized that the relative geometries, dimensions, and orientations depicted in the Figures are exemplary. Other relative geometries, dimensions, and orientations for regions and devices depicted may be implemented and are within the scope of the teachings disclosed herein.

What is claimed is:

1. An electrostatic discharge (ESD) protection device coupled between a first node and a second node, the ESD protection device comprising:
    a first lowly doped region of a P dopant type;
    a second lowly doped region of a N dopant type formed within the first lowly doped region;
    a third lowly doped region of a P dopant type formed within the second lowly doped region;
    a fourth region including a first highly doped region of the N dopant type, wherein the fourth region is formed directly within the third lowly doped region, the first highly doped region is coupled to the first node; and
    a fifth region including a second highly doped region of the P dopant type, wherein the fifth region is formed directly within the first lowly doped region, the second highly doped region is coupled to the second node;
    wherein a voltage at the first highly doped region is higher than a voltage at the second highly doped region, and further wherein a junction between the fourth region and the third lowly doped region is configured to enter into reverse breakdown in response to an ESD event, and a junction between the second lowly doped region and the first lowly doped region is configured to enter into a reverse breakdown in response to the ESD event, such that the ESD protection device is configured to sink current from the first node to the second node in response to an ESD event.

2. The ESD protection device of claim 1, wherein no highly doped region of the P dopant type is formed within the fourth region.

3. The ESD protection device of claim 2, wherein no highly doped region of the N dopant type is formed within the fifth region.

4. The ESD protection device of claim 1, wherein the fourth region further includes a sixth lowly doped region of the N dopant type, and further wherein the first highly doped region is formed within the sixth lowly doped region.

5. The ESD protection device of claim 1, wherein the fifth region further includes a seventh lowly doped region of the P dopant type, and further wherein the second highly doped region is formed within the seventh lowly doped region.

6. The ESD protection device of claim 1, further comprising:
    a biasing element coupled between the third lowly doped region and the second lowly doped region, wherein the biasing element is configured to control a voltage across a forward biased junction formed by the third lowly doped region and the second lowly doped region, and the biasing element includes at least one of: a resistor, a resistive connection, an inductor, a capacitor, a reverse junction, a forward junction, an N-type metal oxide semiconductor (NMOS), a P-type metal oxide semiconductor (PMOS), or a bipolar transistor.

7. The ESD protection device of claim 1, wherein
    an NPN transistor is formed by the fourth region, the third lowly doped region, the second lowly doped region, wherein a collector of the NPN transistor is formed by the fourth region, a base of the NPN transistor is formed by the third lowly doped region, and an emitter of the NPN transistor is formed by the second lowly doped region; and further wherein
    a PNP transistor is formed by the third lowly doped region, the second lowly doped region, the first lowly doped region, and the fifth region, wherein an emitter of the PNP transistor is formed by the third lowly doped region, a base of the PNP transistor is formed by the second lowly doped region, and a collector of the PNP transistor is formed by the first lowly doped region and the fifth region.

8. An electrostatic discharge (ESD) protection device coupled between a first node and a second node, the ESD protection device comprising:
    a first lowly doped region of a N dopant type;
    a second lowly doped region of a P dopant type formed within the first lowly doped region;
    a third lowly doped region of a N dopant type formed within the second lowly doped region;
    a fourth region including a first highly doped region of the N dopant type, wherein the fourth region is formed directly within the first lowly doped region, the first highly doped region is coupled to the first node; and
    a fifth region including a second highly doped region of the P dopant type, wherein the fifth region is formed directly within the third lowly doped region, the second highly doped region is coupled to the second node;
    wherein a voltage at the first highly doped region is higher than a voltage at the second highly doped region, and further wherein a junction between the first lowly doped region and the second lowly doped region is configured to enter into reverse breakdown in response to an ESD event, and a junction between the third lowly doped region and the fifth region is configured to enter into a reverse breakdown in response to the ESD event, such that the ESD protection device is configured to sink current from the first node to the second node in response to an ESD event.

9. The ESD protection device of claim 8, wherein no highly doped region of the P dopant type is formed within the fourth region.

10. The ESD protection device of claim 9, wherein no highly doped region of the N dopant type is formed within the fifth region.

11. The ESD protection device of claim 8, wherein the fourth region further includes a sixth lowly doped region of the N dopant type, and further wherein the first highly doped region is formed within the sixth lowly doped region.

12. The ESD protection device of claim 8, wherein the fifth region further includes a seventh lowly doped region of the P dopant type, and further wherein the second highly doped region is formed within the seventh lowly doped region.

13. The ESD protection device of claim 8, further comprising:
a biasing element coupled between the second lowly doped region and the third lowly doped region, wherein the biasing element is configured to control a voltage across a forward biased junction formed by the second lowly doped region and the third lowly doped region, and the biasing element includes at least one of: a resistor, a resistive connection, an inductor, a capacitor, a reverse junction, a forward junction, an N-type metal oxide semiconductor (NMOS), a P-type metal oxide semiconductor (PMOS), or a bipolar transistor.

14. The ESD protection device of claim 8, wherein an NPN transistor is formed by the fourth region, the first lowly doped region, the second lowly doped region, and the third lowly doped region, wherein a collector of the NPN transistor is formed by the fourth region and the first lowly doped region, a base of the NPN transistor is formed by the second lowly doped region, and an emitter of the NPN transistor is formed by the third lowly doped region; and further wherein a PNP transistor is formed by the second lowly doped region, the third lowly doped region, and the fifth region, wherein an emitter of the PNP transistor is formed by the second lowly doped region, a base of the PNP transistor is formed by the third lowly doped region, and a collector of the PNP transistor is formed by the fifth region.

15. An electrostatic discharge (ESD) protection device coupled between a first node and a second node, the ESD protection device comprising:
an NPN transistor including a first collector, a first emitter, and a first base; and
a PNP transistor including a second collector, a second emitter, and a second base;
wherein the first collector is coupled to the first node, the second collector is coupled to the second node, the first base is coupled to the second emitter, and the first emitter is coupled to the second base, wherein a first lowly doped region of a P dopant type functions as both the first base of the NPN transistor and the second emitter of the PNP transistor, wherein a second lowly doped region of a N dopant type functions as both the first emitter of the NPN transistor and the second base of the PNP transistor, wherein no resistive element is coupled between the first collector and the first base, no resistive element is coupled between the second base and the second collector, and wherein the ESD protection device is configured to sink current from the first node to the second node in response to an ESD event.

16. The ESD protection device of claim 15, wherein the first lowly doped region is formed in the second lowly doped region, the ESD protection device further comprising:
a third lowly doped region of the P dopant type, and the second lowly doped region is formed in the third lowly doped region;
a fourth region including a first highly doped region of the N dopant type functioning as the first collector of the NPN transistor, wherein the fourth region is formed directly in the first lowly doped region, and the first highly doped region is coupled to the first node; and
a fifth region including a second highly doped region of the P dopant type, the third lowly doped region and the fifth region functioning as the second collector of the PNP transistor, wherein the fifth region is formed directly in the third lowly doped region, and the second highly doped region is coupled to the second node.

17. The ESD protection device of claim 16, wherein:
the fourth region further includes a sixth lowly doped region of the N dopant type, the first highly doped region being formed within the sixth lowly doped region; and
the fifth region further includes a seventh lowly doped region of the P dopant type, the second highly doped region being formed within the seventh lowly doped region.

18. The ESD protection device of claim 16, wherein no highly doped region of the P dopant type is formed within the fourth region, and wherein no highly doped region of the N dopant type is formed within the fifth region.

19. The ESD protection device of claim 15, wherein the second lowly doped region is formed in the first lowly doped region, the ESD protection device further comprising:
a third lowly doped region of the N dopant type, and the first lowly doped region is formed in the third lowly doped region;
a fourth region including a first highly doped region of the N dopant type, the third lowly doped region and the fourth region functioning as the first collector of the NPN transistor, wherein the fourth region is formed directly in the third lowly doped region, and the first highly doped region is coupled to the first node; and
a fifth region including a second highly doped region of the P dopant type, the fifth region functioning as the second collector of the PNP transistor, wherein the fifth region is formed directly in the second lowly doped region, and the second highly doped region is coupled to the second node.

20. The ESD protection device of claim 19, wherein:
the fourth region further includes a sixth lowly doped region of the N dopant type, the first highly doped region being formed within the sixth lowly doped region; and
the fifth region further includes a seventh lowly doped region of the P dopant type, the second highly doped region being formed within the seventh lowly doped region.

21. The ESD protection device of claim 19, wherein no highly doped region of the P dopant type is formed within the fourth region, and wherein no highly doped region of the N dopant type is formed within the fifth region.

22. The ESD protection device of claim 15, further comprising:
a biasing element coupled between the first lowly doped region and the second lowly doped region, wherein the biasing element is configured to control a voltage across a forward biased junction formed by the first lowly doped region and the second lowly doped region, and the biasing element includes at least one of: a resistor, a resistive connection, an inductor, a capacitor, a reverse junction, a forward junction, an N-type metal oxide semiconductor (NMOS), a P-type metal oxide semiconductor (PMOS), or a bipolar transistor.

* * * * *